United States Patent
Li et al.

(10) Patent No.: US 12,424,581 B2
(45) Date of Patent: Sep. 23, 2025

(54) CONDUCTIVE ADHESIVE FILM AND FABRICATION METHOD THEREFOR, ELECTRONIC DEVICE AND MANUFACTURE METHOD THEREFOR

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shaopeng Li, Beijing (CN); Weiben Zhang, Beijing (CN); Jianhua Shu, Beijing (CN); Rongkun Fan, Beijing (CN); Qiang Gou, Beijing (CN); Tao Su, Beijing (CN); Hao Deng, Beijing (CN); Tianjun Deng, Beijing (CN); Xiaolong Tang, Beijing (CN); Wenze Li, Beijing (CN); Cheng Zhang, Beijing (CN); Fakui Sun, Beijing (CN); Jing Zhang, Beijing (CN); Yuan Liu, Beijing (CN); Dingjie Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/927,050

(22) PCT Filed: Nov. 26, 2021

(86) PCT No.: PCT/CN2021/133733
§ 371 (c)(1),
(2) Date: Nov. 22, 2022

(87) PCT Pub. No.: WO2023/092509
PCT Pub. Date: Jun. 1, 2023

(65) Prior Publication Data
US 2024/0304586 A1    Sep. 12, 2024

(51) Int. Cl.
C09J 7/20      (2018.01)
C09J 9/02      (2006.01)
H01L 23/00     (2006.01)

(52) U.S. Cl.
CPC ............... H01L 24/29 (2013.01); C09J 7/20 (2018.01); C09J 9/02 (2013.01); H01L 24/27 (2013.01);
(Continued)

(58) Field of Classification Search
CPC ......... H01L 24/29; H01L 24/83; H01L 24/27; H01L 24/32; H01L 2224/27;
(Continued)

(56) References Cited

U.S. PATENT DOCUMENTS 7,531,385 B1 * 5/2009 Karashima .............. H01L 24/29
                                                438/119
7,537,961 B2 * 5/2009 Nakatani ............... B23K 35/264
                                                257/E21.503

(Continued)

FOREIGN PATENT DOCUMENTS

CN    102738088 A    10/2012
CN    106842647 A    6/2017
(Continued)

*Primary Examiner* — Timothy J Thompson
*Assistant Examiner* — Michael F McAllister
(74) *Attorney, Agent, or Firm* — XSENSUS LLP

(57) ABSTRACT

A conductive adhesive film is disclosed. The conductive adhesive film includes a first film layer and a conductive particle layer. The first film layer has a plurality of electrode contact regions and a non-contact region separating the plurality of electrode contact regions. The first film layer has a plurality of gap structures, and the plurality of gap struc-
(Continued)

tures are located at least in the non-contact region. The conductive particle layer is located on a side of the first film layer. The conductive particle layer includes conductive particles. An orthographic projection of the conductive particles on the first film layer overlaps with at least a portion of each electrode contact region.

20 Claims, 21 Drawing Sheets

(52) U.S. Cl.
CPC .............. *H01L 24/32* (2013.01); *H01L 24/83* (2013.01); *C09J 2203/326* (2013.01); *C09J 2301/16* (2020.08); *C09J 2301/204* (2020.08); *C09J 2301/206* (2020.08); *C09J 2301/208* (2020.08); *H01L 2224/27* (2013.01); *H01L 2224/29082* (2013.01); *H01L 2224/2919* (2013.01); *H01L 2224/2929* (2013.01); *H01L 2224/293* (2013.01); *H01L 2224/2939* (2013.01); *H01L 2224/29393* (2013.01); *H01L 2224/32238* (2013.01); *H01L 2224/83851* (2013.01)

(58) Field of Classification Search
CPC ... H01L 2224/29082; H01L 2224/2919; H01L 2224/2929; H01L 2224/293; H01L 2224/2939; H01L 2224/29393; H01L 2224/32238; H01L 2224/83851; C09J 7/20; C09J 7/30; C09J 7/10; C09J 2301/314; C09J 2301/208; C09J 2301/408; C09J 2301/16; C09J 2301/204; C09J 2301/206; C09J 9/02; C09J 2203/318; C09J 2203/326; C09J 2463/00; C08K 2201/001; H01B 5/14
USPC ........................................................ 174/259
See application file for complete search history.

(56) References Cited

U.S. PATENT DOCUMENTS

| | | | | |
|---|---|---|---|---|
| 7,820,021 | B2* | 10/2010 | Karashima | H01L 24/83 |
| | | | | 204/242 |
| 8,016,181 | B2* | 9/2011 | Saimen | H05K 3/363 |
| | | | | 228/248.1 |
| 10,080,298 | B2* | 9/2018 | Eifuku | H05K 1/11 |
| 2009/0208731 | A1* | 8/2009 | Saimen | H05K 3/323 |
| | | | | 428/327 |
| 2016/0026061 | A1 | 1/2016 | O'Keeffe | |
| 2018/0298206 | A1 | 10/2018 | Paik et al. | |
| 2020/0010740 | A1* | 1/2020 | Lee | H01L 24/13 |
| 2021/0114147 | A1 | 4/2021 | Akai et al. | |
| 2023/0035388 | A1 | 2/2023 | Lin | |

FOREIGN PATENT DOCUMENTS

| | | |
|---|---|---|
| CN | 209947452 U | 1/2020 |
| CN | 209947454 U | 1/2020 |
| CN | 112135467 A | 12/2020 |
| CN | 112313032 A | 2/2021 |
| CN | 113161242 A | 7/2021 |
| JP | 2006-96788 A | 4/2006 |

* cited by examiner

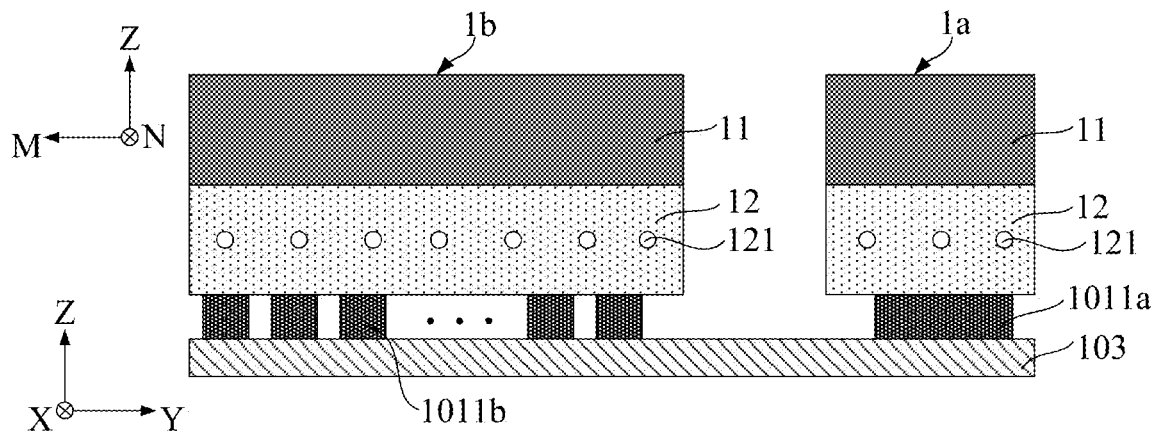

FIG. 34

```
┌─────────────────────────────────────────────────────┐
│ A substrate is provided, the substrate having a chip │
│ mounting region and including a plurality of first   │──S1'
│ raised electrodes located in the chip mounting       │
│ region, the plurality of first raised electrodes     │
│ being arranged at intervals                          │
└─────────────────────────────────────────────────────┘
                          │
                          ▼
┌─────────────────────────────────────────────────────┐
│ A driving chip is provided, the driving chip having  │
│ a plurality of second raised electrodes, the         │──S2'
│ plurality of second raised electrodes being          │
│ arranged at intervals                                │
└─────────────────────────────────────────────────────┘
                          │
                          ▼
┌─────────────────────────────────────────────────────┐
│ At least one conductive adhesive film is provided    │──S3'
│ between the plurality of first raised electrodes     │
│ and the plurality of second raised electrodes        │
└─────────────────────────────────────────────────────┘
                          │
                          ▼
┌─────────────────────────────────────────────────────┐
│ The driving chip and the substrate are pressed       │──S4'
│ together, so as to bond the plurality of first       │
│ raised electrodes to the plurality of second         │
│ raised electrodes                                    │
└─────────────────────────────────────────────────────┘
```

FIG. 35

| A conductive adhesive film is provided, a second film layer of the conductive adhesive film is removed, and a conductive particle layer of the conductive adhesive film is attached to the substrate, so as to make the conductive adhesive film completely cover the first raised electrodes of the substrate | S31 |

| The driving chip is attached to the side of the first film layer away from the conductive particle layer, so as to make the second raised electrodes correspond to the first raised electrodes in a one-to-one manner | S32 |

FIG. 37

CONDUCTIVE ADHESIVE FILM AND FABRICATION METHOD THEREFOR, ELECTRONIC DEVICE AND MANUFACTURE METHOD THEREFOR

CROSS-REFERENCE TO RELATED APPLICATION

This application is a national phase entry under 35 USC 371 of International Patent Application No. PCT/CN2021/133733 filed on Nov. 26, 2021, which is incorporated herein by reference in its entirety.

TECHNICAL FIELD

The present disclosure relates to the field of display technologies, and in particular, to a conductive adhesive film and a fabrication method therefor, an electronic device and a manufacture method therefor.

BACKGROUND

Organic light-emitting diode (OLED) display panels have gradually become one of mainstreams in the display field due to excellent performances thereof such as low power consumption, high color saturation, wide viewing angle, small thickness and capability of realizing flexibility.

SUMMARY

In one aspect, a conductive adhesive film is provided. The conductive adhesive film includes: a first film layer and a conductive particle layer. The first film layer has a plurality of electrode contact regions and a non-contact region separating the plurality of electrode contact regions. The first film layer has a plurality of gap structures. The plurality of gap structures are located at least in the non-contact region. The conductive particle layer is located on a side of the first film layer. The conductive particle layer includes conductive particles therein. An orthographic projection of the conductive particles on the first film layer overlaps with at least a portion of each electrode contact region.

In some embodiments, the plurality of gap structures are further located in the electrode contact regions.

In some embodiments, for the plurality of gap structures, a total volume of gap structures located in the non-contact region is greater than a total volume of gap structures located in the electrode contact regions.

In some embodiments, for the plurality of gap structures, a density of the gap structures located in the non-contact region is greater than a density of the gap structures located in the electrode contact regions.

In some embodiments, for the plurality of gap structures, an area of a cross section of a gap structure located in the non-contact region is greater than an area of a cross section of a gap structure located in the electrode contact region. Each cross section is perpendicular to an extension direction of a respective gap structure.

In some embodiments, the plurality of gap structures include each clearance groove, and the at least one clearance groove is located on the side of the first film layer proximate to the conductive particle layer or on a side of the first film layer away from the conductive particle layer. Alternatively, the plurality of gap structures include at least one clearance hole, and an axis of the at least one clearance hole is parallel to the first film layer.

In some embodiments, in a case where the plurality of gap structures include the at least one clearance groove: a section, in a plane perpendicular to an extension direction of the at least one clearance groove, of the at least one clearance groove is in a shape of a rectangle, a trapezoid or a U-shape; and/or the at least one clearance groove is a through groove extending in a direction parallel to the first film layer.

In some embodiments, in a case where the plurality of gap structures include the at least one clearance groove, the first film layer includes: a first base material and a plurality of first film blocks. The plurality of first film blocks are disposed on a side of the first base material. Two adjacent first film blocks and the first base material provide a clearance groove of the at least one clearance groove together.

In some embodiments, in a case where the plurality of gap structures include the at least one clearance hole: a section, in a plane perpendicular to a direction of the axis of the at least one clearance hole, of the at least one clearance hole is in a shape of a circle, an ellipse or a rectangle; and/or the at least one clearance hole is a through hole.

In some embodiments, in a case where the plurality of gap structures include the at least one clearance groove, the first film layer includes: a second base material, a third base material and a plurality of second film blocks. The plurality of second film blocks are disposed between the second base material and the third base material. Two adjacent second film blocks, the second base material and the third base material provide a clearance hole of the at least one clearance hole together.

In some embodiments, the plurality of gap structures extend in a first direction and are sequentially arranged in a second direction. The first direction is perpendicular to the second direction, and both the first direction and the second direction are parallel to the first film layer.

In some embodiments, a maximum dimension of at least one gap structure of the plurality of gap structures in a third direction is $c_1$. A dimension of the first film layer in the third direction is $a_1$. The third direction is perpendicular to the first film layer. $c_1$ and $a_1$ satisfy: $c_1$ is equal to $k_0$ times $a_1$ ($c_1 = k_0 \times a_1$), where $k_0$ is greater than or equal to 20% and less than or equal to 30% ($20\% \leq k_0 \leq 30\%$).

In some embodiments, two adjacent gap structures have a first distance $d_1$ therebetween, and $d_1$ satisfies: $d_1$ is equal to $k_1$ times $c_1$ ($d_1 = k_1 \times c_1$), where $k_1$ is greater than or equal to 2 and less than or equal to 3 ($2 \leq k_1 \leq 3$).

In some embodiments, the first film layer includes a first region and a second region that are sequentially arranged in the second direction. Within the first region, two adjacent gap structures have a second distance $d_2$ therebetween. Within the second region, two adjacent gap structures have a third distance $d_3$ therebetween. $d_2$ and $d_3$ satisfy: $d_2$ is equal to $k_2$ times $c_1$ ($d_2 = k_2 \times c_1$), $k_2$ is greater than or equal to 2 and less than or equal to 3 ($2 \leq k_2 \leq 3$); $d_3$ is equal to $k_3$ times $c_1$ ($d_3 = k_3 \times c_1$), and $k_3$ is greater than or equal to 4 and less than or equal to 6 ($4 \leq k_3 \leq 6$).

In some embodiments, the first film layer includes a third region, a fourth region and a fifth region that are sequentially arranged in the second direction. Within the third region, two adjacent gap structures have a fourth distance $d_4$ therebetween. Within the fourth region, two adjacent gap structures have a fifth distance $d_5$ therebetween. Within the fifth region, two adjacent gap structures have a sixth distance $d_6$ therebetween. $d_4$, $d_5$ and $d_6$ satisfy: $d_4$ and $d_6$ each are equal to $k_4$ times $c_1$ ($d_4 = d_6 = k_4 \times c_1$), $k_4$ is greater than or equal to 1 and less than or equal to 1.5 ($1 \leq k_4 \leq 1.5$), $d_5$ is equal to k5 times c1 (d5=k5×c1), and k5 is greater than or equal to 4 and less than or equal to 6 (4≤k5≤6).

Alternatively, d4, d5 and d6 satisfy: d4 is equal to k6 times c1 (d4=k6×c1), k6 is greater than or equal to 1 and less than or equal to 1.5 (1≤k6≤1.5), d5 is equal to k7 times c1 (d5=k7×c1), k7 is greater than or equal to 2 and less than or equal to 3 (2≤k7≤3), d6 is equal to k8 times c1 (d6=k8×c1), and k8 is greater than or equal to 4 and less than or equal to 6 (4≤k8≤6).

In some embodiments, in a case where the first film layer has the third region, the fourth region and the fifth region that are sequentially arranged in the second direction, a length of the first film layer in the second direction is L1. A length of the third region in the second direction is L2. A length of the fourth region in the second direction is L3. A length of the fifth region in the second direction is L4. A sum of lengths of the third region and the fourth region in the second direction is L5. In a case where d4, d5 and d6 satisfy:

d4=d6=k4×c1, 1≤k4≤1.5, d5=k5×c1, and 4≤k5≤6, L1, L2, L3 and L4 satisfy: L3 is equal to k9 times L1 (L3=k9×L1), k9 is greater than or equal to 40% and less than or equal to 60%(40%≤k9≤60%), a sum of L2 and L4 is equal to k10 times L1 (L2+L4=k10×L1), k10 is greater than or equal to 40% and less than or equal to 60% (40%≤k10≤60%), and L2 is equal to L4 (L2=L4). In a case where d4, d5 and d6 satisfy: d4=k6×c1, 1≤k6≤1.5, d5=k7×c1, 2≤k7≤3, d6=k8×c1, and 4≤k8≤6, L2, L3 and L5 satisfy: L2 is equal to k11 times L5 (L2=k11×L5), k11 is greater than or equal to 40% and less than or equal to 60%(40%≤k11≤60%), L3 is equal to k12 times L5 (L3=k12×L5), and k12 is greater than or equal to 40% and less than or equal to 60% (40%≤k12≤60%).

In some embodiments, the conductive adhesive film further includes: a second film layer. The second film layer is releasably attached to a side of the first film layer away from the conductive particle layer.

In another aspect, a method for fabricating a conductive adhesive film is provided. The method includes: forming a first film layer, the first film layer having a plurality of electrode contact regions and a non-contact region separating the plurality of electrode contact regions, the first film layer having a plurality of gap structures therein, the plurality of gap structures being located at least in the non-contact region; and forming a conductive particle layer on a side of the first film layer, the conductive particle layer including conductive particles, an orthographic projection of the conductive particles on the first film layer overlapping with at least a portion of each electrode contact region.

In some embodiments, the plurality of gap structures include at least one clearance groove. Forming the first film layer includes: providing a first base material; and forming a plurality of first film blocks on a side of the first base material. Two adjacent first film blocks and the first base material provide a clearance groove of the at least one clearance groove together.

Alternatively, the plurality of gap structures include at least one clearance hole. Forming the first film layer includes: providing a second base material; forming a plurality of second film blocks on a side of the second base material; and forming a third base material on a side of the plurality of second film blocks away from the second base material. Two adjacent second film blocks, the second base material and the third base material provide a clearance hole of the at least one clearance hole together.

In some embodiments, the method further includes: forming a second film layer on a side of the first film layer away from the conductive particle layer. The second film layer is releasably attached to the side of the first film layer away from the conductive particle layer.

In yet another aspect, an electronic device is provided. The electronic device includes: a substrate and a driving chip. The substrate has a chip mounting region. The substrate includes a plurality of first raised electrodes located in the chip mounting region. The plurality of first raised electrodes are arranged at intervals. The driving chip has a plurality of second raised electrodes, and the plurality of second raised electrodes are arranged at intervals. The plurality of first raised electrodes of the substrate are bonded to the plurality of second raised electrodes of the driving chip through at least one conductive adhesive film each as described in any one of the above embodiments.

In some embodiments, the plurality of first raised electrodes are arranged in a plurality of rows and a plurality of columns. First raised electrodes in a first row are input electrodes, and first raised electrodes in remaining rows are output electrodes. A distance between the input electrodes and output electrodes in an adjacent row is greater than a distance between output electrodes in two adjacent rows. The plurality of gap structures of the conductive adhesive film extend in a row direction or a column direction of the plurality of first raised electrodes.

In yet another aspect, a method for manufacturing an electronic device is provided. The method for manufacturing the electronic device includes: providing a substrate, the substrate having a chip mounting region, the substrate including a plurality of first raised electrodes located in the chip mounting region, the plurality of first raised electrodes being arranged at intervals; providing a driving chip, the driving chip having a plurality of second raised electrodes, the plurality of second raised electrodes being arranged at intervals; providing at least one conductive adhesive film between the plurality of first raised electrodes and the plurality of second raised electrodes; and pressing the driving chip and the substrate together, so as to bond the plurality of first raised electrodes to the plurality of second raised electrodes. The conductive adhesive film is the conductive adhesive film according to any one of the above embodiments. The at least one conductive adhesive film includes one conductive adhesive film; or, the at least one conductive adhesive film includes a plurality of the conductive adhesive films, and the plurality of conductive adhesive films are arranged at intervals in a plane parallel to the substrate before the driving chip and the substrate are pressed.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person having ordinary skill in the art can obtain other drawings according to these accompanying drawings. In addition, the accompanying drawings in the following description may be regarded as schematic diagrams, but are not limitations on an actual size of a product, an actual process of a method and an actual timing of a signal involved in the embodiments of the present disclosure.

FIG. 34 is a diagram showing yet another structure where a conductive adhesive film is disposed on a substrate, in accordance with some embodiments;

FIG. 35 is a flowchart of a method for manufacturing an electronic device, in accordance with some embodiments;

FIG. 37 is a flowchart of another method for manufacturing an electronic device, in accordance with some embodiments;

DETAILED DESCRIPTION

Figure 1:
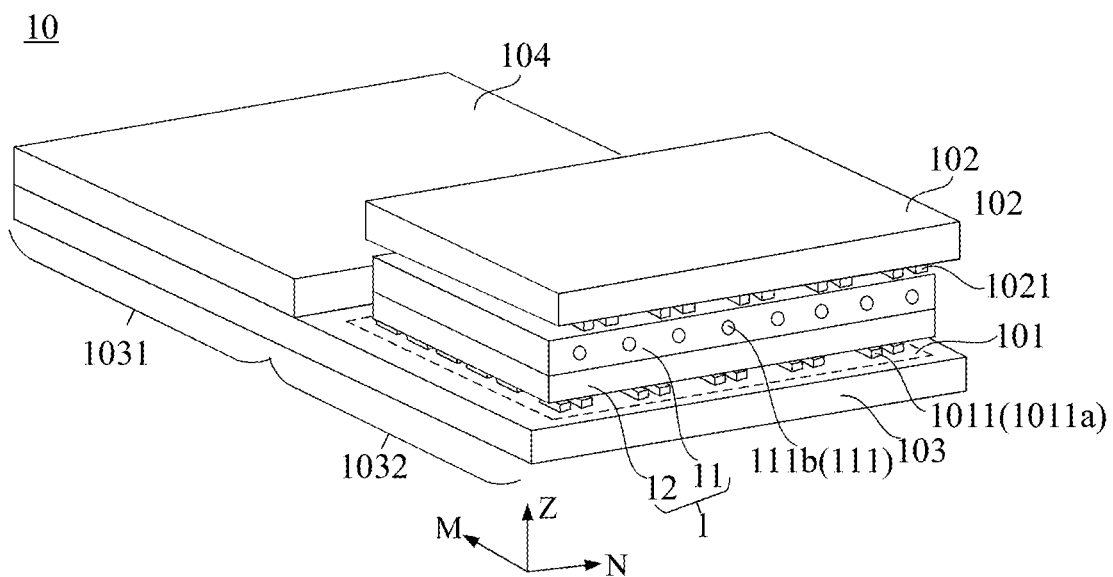
FIG. 1 is a diagram showing a stacked structure of an electronic device before a conductive adhesive film is pressed, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner. Unless the context requires otherwise, throughout the specification and the claims, the term "comprise" and other forms thereof such as the third-person singular form "comprises" and the present participle form "comprising" are construed in an open and inclusive sense, i.e., "including, but not limited to". Schematic representation of the above terms does not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

The phrase "A and/or B" includes the following three combinations: only A, only B, and a combination of A and B.

As used herein, the terms such as "parallel", "perpendicular" or "equal" include a stated case and a case similar to the stated case. The similar case is within an acceptable range of deviation, and the acceptable range of deviation is determined by a person of ordinary skill in the art in view of measurement in question and errors associated with measurement of a particular quantity (i.e., limitations of a measurement system). For example, the term "parallel" includes absolute parallelism and approximate parallelism, and an acceptable range of deviation of the approximate parallelism may be a deviation within 5 degrees. For example, the term "perpendicular" includes absolute perpendicularity and approximate perpendicularity, and an acceptable range of deviation of the approximate perpendicularity may be a deviation within 5 degrees. For example, the term "equal" includes absolute equality and approximate equality, and an acceptable range of deviation of the approximate equality may refer to that, a difference between two equals is less than or equal to 5% of either of the two equals.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

In organic light-emitting diode (OLED) display devices, in order to meet requirements of products with high definition, high resolution, large size, and foldability, a number of raised electrodes of a driving chip or a number of driving chips is increasing, and then a number of raised electrodes in a bonding region of an OLED display panel is increasing.

Figure 39:
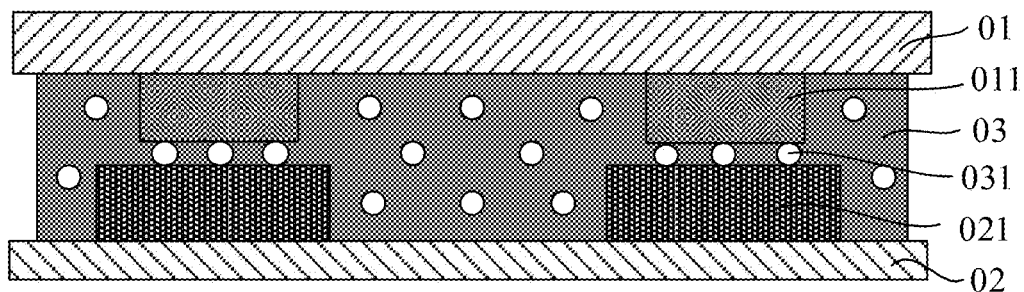
FIG. 39 is a diagram showing a structure of a display panel and a driving chip ideally bonded thereto.
Figure 40:
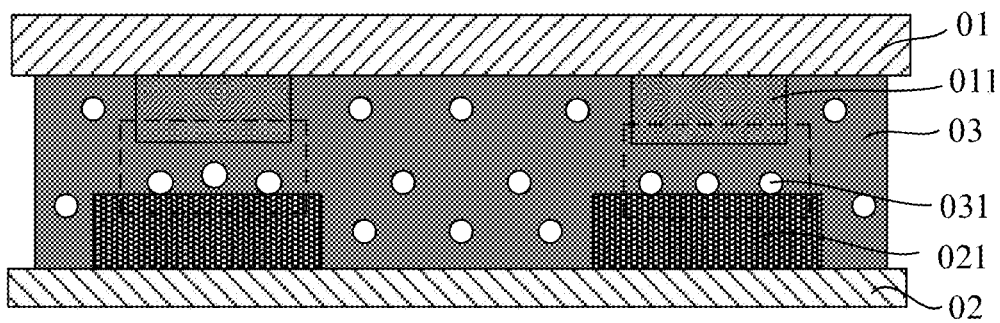
FIG. 40 is a diagram showing a structure of a display panel and a driving chip bonded thereto in related art.
Figure 41:
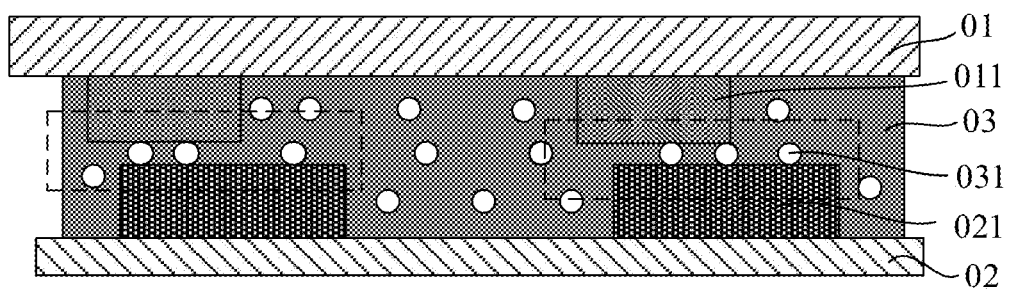
FIG. 41 is a diagram showing another structure of a display panel and a driving chip bonded thereto in related art.

With reference to FIG. 39, in a case where a driving chip 01 is bonded to a display panel 02 through a conductive adhesive film 03 in a good bonding state, there should be a layer of conductive particles 031 between chip raised electrodes 011 of the driving chip 01 and respective substrate raised electrodes 021 of the display panel 02, the conductive particles 031 are in contact with both the chip raised electrodes 011 and the substrate raised electrodes 021, and the conductive particles 031 are deformed by a certain degree of compression. However, in a case where a size of a bonding region of the display panel 02 has been determined, as a number of the substrate raised electrodes 021 to be bonded increases, distances between substrate raised electrodes 021 decrease, and flow at various positions is non-uniform. With reference to FIG. 40, in a case where the driving chip 01 is attached to the display panel 02 through the conductive adhesive film 03, the conductive adhesive film 03 between the driving chip 01 and the display panel 02 overflows non-uniformly, and the conductive adhesive film 03 cannot effectively escape. This causes that an adhesive material and conductive particles 031, between two adjacent chip raised electrodes 011 (or two adjacent substrate raised electrodes 021) and between the chip raised electrodes 011 and respective substrate raised electrodes 021 that are to be bonded, accumulate, thereby generating a weak pressure. Consequently, the display panel 02 fails to be lit. In addition, with reference to FIG. 41, an adhesive solution of the conductive adhesive film 03 has poor flow stability. During pressing, forces on different portions of the driving chip 01 are unbalanced, and the driving chip 01 will move towards a single side as the adhesive solution flows, which is prone to cause a misalignment between the raised electrodes 011 and the substrate raised electrodes 021 that are to be bonded, thereby resulting in a poor bonding accuracy.

Figure 2:
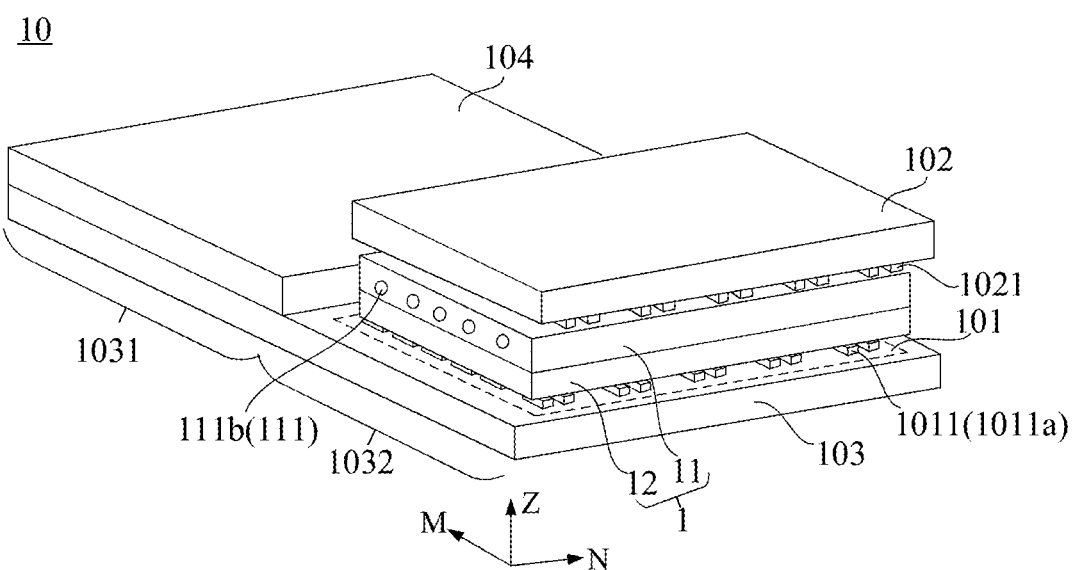
FIG. 2 is a diagram showing a stacked structure of another electronic device before a conductive adhesive film is pressed, in accordance with some embodiments.

In light of this, some embodiments of the present disclosure provide electronic devices 10. With reference to FIGS. 1 and 2, FIG. 1 is a diagram showing a stacked structure of an electronic device 10 before a conductive adhesive film is pressed in accordance with some embodiments, and FIG. 2 is a diagram showing a stacked structure of another electronic device 10 before a conductive adhesive film is pressed in accordance with some embodiments. The electronic device 10 includes: a substrate 101 and a driving chip 102. The substrate 101 has a chip mounting region (e.g., a region shown by a dashed box in FIG. 1 or 2). The substrate 101 includes a plurality of first raised electrodes 1011 located in the chip mounting region, and the plurality of first raised electrodes 1011 are arranged at intervals. The driving chip 102 has a plurality of second raised electrodes 1021, and the plurality of second raised electrodes 1021 are arranged at intervals. The plurality of first raised electrodes 1011 of the substrate 101 are bonded to the plurality of second raised electrodes 1021 of the driving chip 102 through at least one conductive adhesive film 1.

Figure 3:
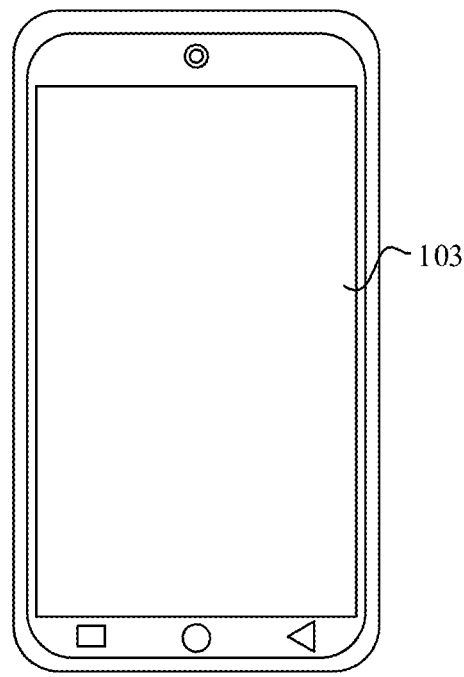
FIG. 3 is a diagram showing a structure of an electronic device, in accordance with some embodiments.

With reference to FIG. 3, in some examples, the electronic device 10 may be a mobile telephone. In some other examples, the electronic device 10 may be (but is not limited to) a wireless apparatus, a personal data assistant (PDA), a hand-held or portable computer, a GPS receiver/navigator, a camera, an MP4 video player, a video camera, a game console, a watch, a clock, a calculator, a television monitor, a flat panel display, a computer monitor, an automobile display (e.g., an odometer display), a navigator, a cockpit controller and/or display, a display of camera views (e.g., a display of a rear-view camera in a vehicle), an electronic photo, an electronic billboard or sign, a projector, a building structure, a packaging and aesthetic structure (e.g., a display for displaying an image of a piece of jewelry), or the like.

With reference to FIGS. 1 and 2 again, in some examples, the electronic device 10 further includes a display panel 103 having the substrate 101. The display panel 103 has a display region 1031 and a peripheral region 1032 on at least one side of the display region 1031. The display region 1031 is provided therein with a plurality of pixels. For example, each pixel includes sub-pixels of at least three colors. The sub-pixels of the colors at least include a sub-pixel of a first color, a sub-pixel of a second color and a sub-pixel of a third color. The first color, the second color and the third color are three primary colors (e.g., red, green and blue).

A bonding region is provided on least one side of the peripheral region 1032. A portion of the substrate 101 is disposed in the bonding region. The display panel 103 is further provided therein with a plurality of signal lines (not shown in the figures). The plurality of signal lines are electrically connected to the plurality of pixels in the display region 1031, and ends, located in the bonding region, of the plurality of signal lines are connected to the first raised electrodes 1011 of the substrate 101 in the bonding region. Since the first raised electrodes 1011 are electrically connected with the second raised electrodes 1021 of the driving chip 102, the driving chip 102 can control the display panel 103 to display an image.

In some examples, with continued reference to FIGS. 1 and 2, the display panel 103 in the display region 1031 is further provided therein with an anti-reflective layer 104.

Some embodiments of the present disclosure provide a conductive adhesive film 1. The conductive adhesive film 1 may be applied to the electronic device 10.

Figure 4:
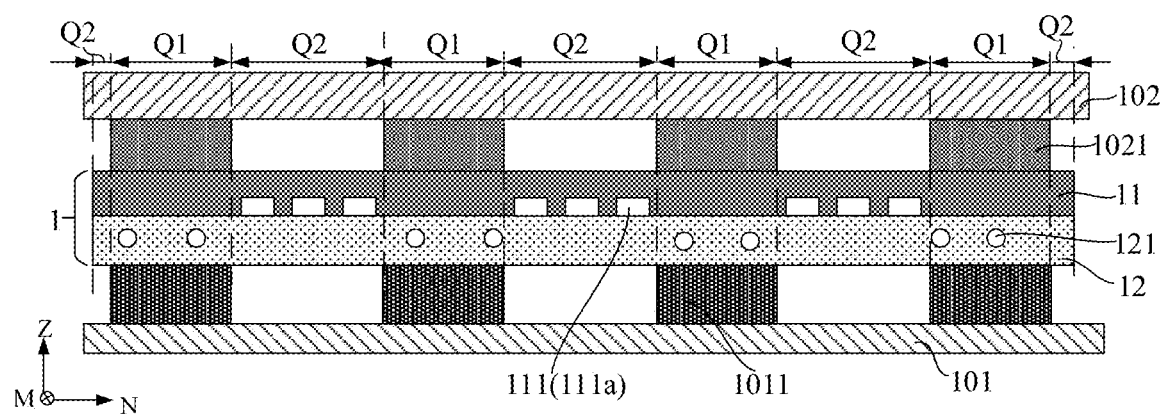
FIG. 4 is a section of an electronic device before a conductive adhesive film is pressed, in accordance with some embodiments.
Figure 5:
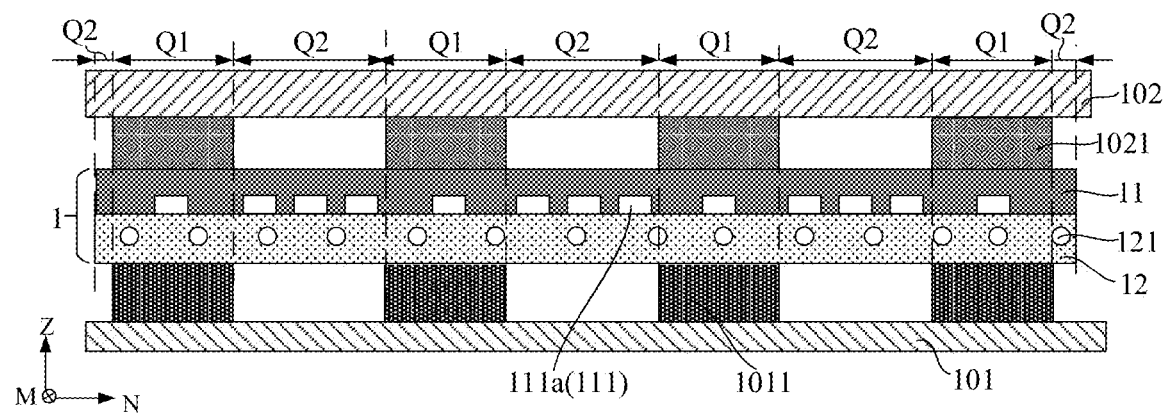
FIG. 5 is a section of another electronic device before a conductive adhesive film is pressed, in accordance with some embodiments.
Figure 6:
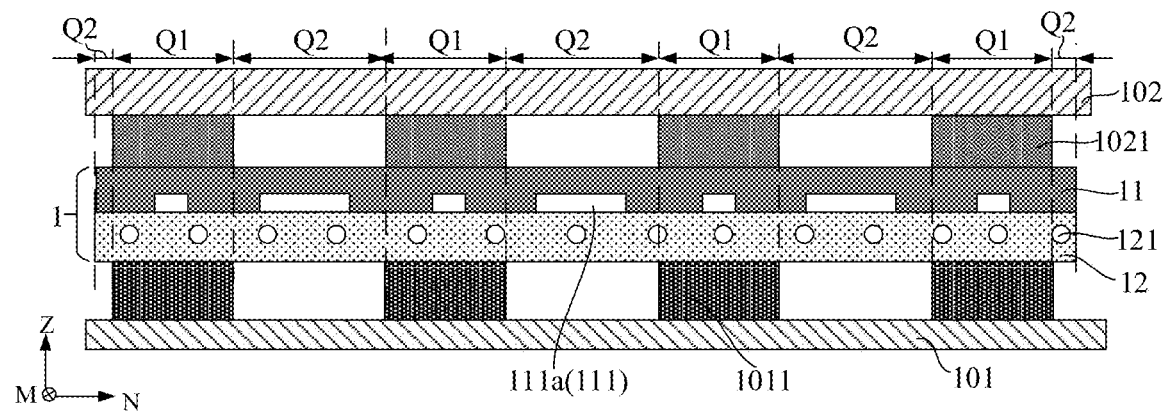
FIG. 6 is a section of yet another electronic device before a conductive adhesive film is pressed, in accordance with some embodiments.

With reference to FIGS. 4 to 6, the conductive adhesive film 1 includes: a first film layer 11 and a conductive particle layer 12.

The first film layer 11 includes a plurality of electrode contact regions Q1 and a non-contact region Q2 separating the plurality of electrode contact regions Q1. The first film layer 11 has a plurality of gap structures 111. The plurality of gap structures 111 are located at least in the non-contact region Q2. For example, as shown in FIG. 4, the plurality of gap structures 111 may be all located in the non-contact region Q2.

It will be noted that, the electrode contact regions Q1 are used to be disposed corresponding to the first raised electrodes 1011 and the second raised electrodes 1021 that are to be bonded. For example, as shown in FIG. 4, the first film layer 11 may include the electrode contact regions Q1 and portions of the non-contact region Q2 that are arranged alternately in a direction N. A first raised electrode 1011 and a second raised electrode 1021 that are to be bonded are located in a region where an electrode contact region Q1 is located in a direction Z.

A gap structure 111 may extend in a direction parallel to the conductive particle layer 12, or penetrate both a main surface of the conductive particle layer proximate to the first film layer and a main surface of the conductive particle layer away from the first film layer, which is not limited in embodiments of the present disclosure.

The conductive particle layer 12 is located on a side of the first film layer 11. The conductive particle layer 12 includes conductive particles 121. An orthographic projection of the conductive particles 121 on the first film layer 11 overlaps with at least a portion of each electrode contact region Q1. For example, as shown in FIG. 4, the orthographic projection of the conductive particles 121 on the first film layer 11 may only overlap with a portion of each electrode contact region Q1.

In some examples, the first film layer 11 is made of a resin material. For example, the first film layer 11 is made of epoxy resin.

In some examples, the conductive particles 121 are metal particles. In some other examples, the conductive particles 121 may be made of a polymer or carbon fibers.

In some examples, in addition to the conductive particles 121, the conductive particle layer 12 further includes an adhesive material (e.g., a resin). Raw materials for making the conductive particle layer 12 may be prepared by doping the adhesive material with the conductive particles 121.

In the conductive adhesive film 1 provided in some embodiments of the present disclosure, by providing the plurality of gap structures 111 that are located at least in the non-contact region Q2, an adhesive solution (i.e., the adhesive film 1 in a flowing state) may flow into the gap structures 111 when the adhesive solution overflows during bonding. Compared with an adhesive film of a solid structure, the conductive adhesive film 1 may have a larger space for overflow of the adhesive solution by means of the gap structures 111 disposed in the non-contact region Q2, which ensures that the adhesive solution effectively escapes from regions between the first raised electrodes 1011 and the second raised electrodes that are to be bonded, and ameliorates an accumulation of the adhesive material and the conductive particles 121 between the electrodes to be bonded. Therefore, a contact rate of effective conductive particles 121 between the first raised electrodes 1011 and the second raised electrodes 1021 to be bonded may also be improved, and a risk of weak pressure may be reduced. An effective conductive particle 121 refers to a conductive particle 121 that enables a first raised electrode 1011 to be electrically connected to a second raised electrode 1021 after bonding.

In addition, by providing the gap structures 111, it is beneficial to save the materials of the conductive adhesive film, thereby reducing production costs of the conductive adhesive film 1.

It will be noted that, by controlling sizes and an arrangement of the gap structures 111, a direction in which the adhesive solution overflows may be controlled, and fluidity of the adhesive solution may be improved, so that adhesive-overflowing uniformity at various positions and in various directions may be improved, and then an bonding error of the structures to be bonded may be reduced.

When the conductive adhesive film 1 is to be used, the conductive adhesive film 1 needs to be heated to melt and soften the first film layer 11 and the conductive particle layer 12, and then a portion of the conductive adhesive film 1 is placed between two raised electrodes to be bonded together, and finally the two raised electrodes to be bonded together are pressed against each other, so that the two raised electrodes are bonded together through the conductive adhesive film 1. When the first film layer 11 and the conductive particle layer 12 of the conductive adhesive film 1 flow, flow velocities of the first film layer 11 and the conductive particle layer 12 are different, and the first film layer 11 may drive the conductive particles 121 to move, so that the contact rate of the effective conductive particles 121 between the first raised electrodes 1011 and the second raised electrodes 1021 to be bonded is improved. A conduction principle of the conductive adhesive film 1 is as follows: using the conductive particles 121 to connect electrodes of structures to be bonded together to realize a connection between the structures, while a connection between two adjacent electrodes which causes a short circuit may be avoided, so that a purpose of connection only in a direction perpendicular to the first film layer 11 is achieved.

In some examples, as shown in FIGS. 5 and 6, the plurality of gap structures 111 are further located in the electrode contact regions Q1 in addition to the non-contact regions Q2.

By such a design, it may be possible to provide a large space for the overflow of the adhesive solution of the conductive adhesive film 1 located between the first raised electrodes 1011 and the second raised electrodes 1021 that are to be bonded, and avoid the accumulation of the adhesive material and the conductive particles 121 between the first raised electrodes 1011 and the second raised electrodes 1021 that are to be bonded. Therefore, the risk of weak pressure is reduced, and a reliable electrical connection between the two kinds of raised electrodes (i.e., the first raised electrodes 1011 and the second raised electrodes 1021) is ensured.

In some examples, with continued reference to FIGS. 5 and 6, the orthographic projection of the conductive particles 121 of the conductive particle layer on the first film layer 11 further overlaps with the non-contact region Q2 in addition to the electrode contact regions Q1.

The more the conductive particles 121 provided in the conductive particle layer 12 are, the larger the coverage thereof is, and the better the contact rate of the conductive particles 121 between the first raised electrodes 1011 and the second raised electrodes 1021 may be improved. Therefore, it may be possible to ensure conductivity between the first raised electrodes 1011 and the second raised electrodes 1021 that are to be bonded.

Figure 7:
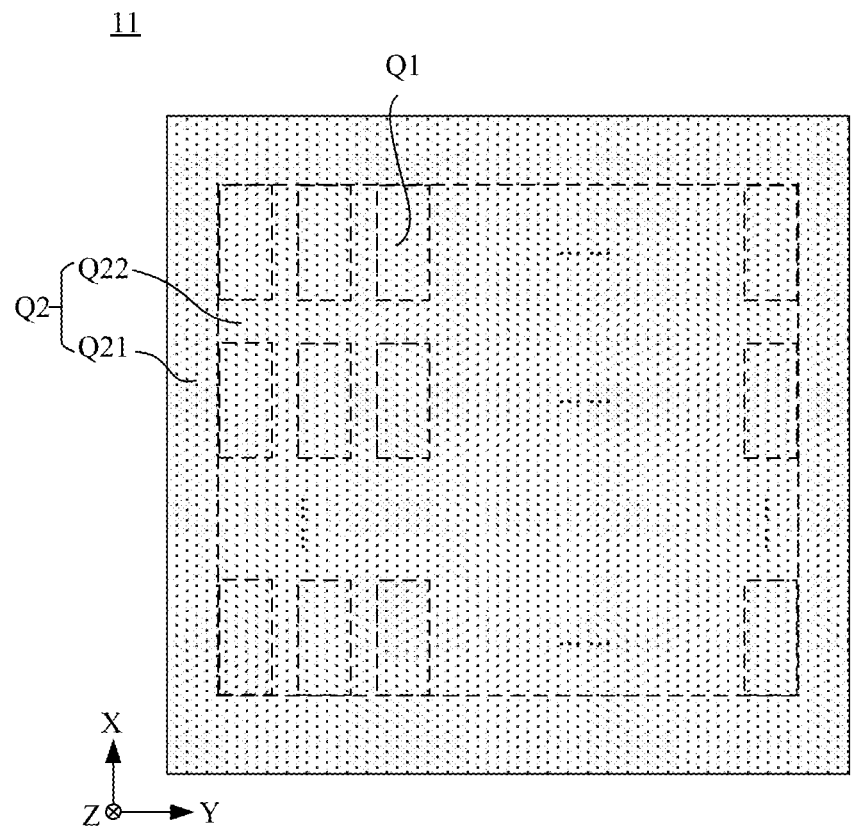
FIG. 7 is a diagram showing a structure of a first film layer, in accordance with some embodiments.

In some examples, with reference to FIG. 7, in a direction parallel to the first film layer 11, the non-contact region Q2 includes an annular region Q21 surrounding a peripheral of the plurality of electrode contact regions Q1 and a mesh region Q22 located within the annular region Q21. By such a design, after the non-contact region Q2 is provided therein with gap structures 11, it is beneficial for conductive adhesive film 1 to overflow uniformly to a great extent.

In some embodiments, the conductive particle layer 12 may also be provided therein with gap structures. By such a design, the space for the overflow of the adhesive solution may be further increased, and the fluidity of the conductive particle layer 12 may be further improved. In addition, since the conductive particles 121 are located in the conductive particle layer 12, the gap structures disposed on the conductive particle layer 12 are proximate to the conductive particles 121. Thus, it is conducive to adjusting a direction in which the conductive particles 121 flow, and then improving the contact rate of the effective conductive particles 121 between the first raised electrodes 1011 and the second raised electrodes 1021 that are bonded.

In some examples, a portion of the conductive particle layer 12 covering the non-contact region Q2 is provided therein with gap structures. In some other examples, both the portion of the conductive particle layer 12 covering the non-contact region Q2 and the portions of the conductive particle layer 12 covering the electrode contact regions Q1 are provided therein with gap structures.

It will be noted that, gap structures in the conductive particle layer 12 may be arranged in a same manner as gap structures 111 in the first film layer 11, which will not be repeated here.

In some embodiments, among the plurality of gap structures 111 of the first film layer 11, a total volume of the gap structures 111 located in the non-contact region Q2 is greater than a total volume of the gap structures 111 located in the electrode contact regions Q1.

By such a design, the non-contact region Q2 may have a large space for overflow of the adhesive solution than the electrode contact regions Q1, thereby ensuring that adhesive solution in both the electrode contact regions Q1 and the non-contact region Q2 may effectively overflow.

In some embodiments, among the plurality of gap structures 111 in the first film layer 11, a density of the gap structures 111 located in the non-contact region Q2 is greater than a density of the gap structures 111 located in the electrode contact regions Q1.

It will be explained that, the "density" at which the gap structures 111 are arranged refers to a number of gap structures 111 disposed in a same space. The "a density of the gap structures 111 located in the non-contact region Q2 being greater than a density of the gap structures 111 located in the electrode contact regions Q1" may mean that: a number of the gap structures 111 disposed in the non-contact regions Q2 is greater than a number of the gap structures 111 disposed in the electrode contact regions Q1. Since a portion of adhesive solution in the electrode contact regions Q1 needs to escape to the non-contact region Q2, the non-contact region Q2 needs a relative large space for overflow of the adhesive solution. By such a design above, it may be possible to ensure that adhesive solution at different positions effectively and uniformly overflow, and avoid the accumulation of the adhesive material and the conductive particles 121.

For example, with reference to FIG. 5, in regions in a direction N, an electrode contact region Q1 between two portions of the non-contact region Q2 is provided with a same gap structure 111 (i.e., a clearance groove 111a). A length of the electrode contact region Q1 in the direction N is substantially equal to a length of a portion of the non-contact region Q2 between two electrode contact regions Q1 in the direction N; and the portion of the non-contact region Q2 is provided therein with three gap structures 111, and the electrode contact region Q1 between the two portions of the non-contact region Q2 is provided therein with one gap structure 111. That is to say, the density of the gap structures 111 located in the non-contact region Q2 is greater than the density of the gap structures 111 located in the electrode contact regions Q1. By such a design, it may be possible to ensure that the adhesive solution in both the electrode contact regions Q1 and the non-contact region Q2 may effectively overflow.

In some embodiments, among the plurality of gap structures 111 of the first film layer 11, an area of a cross section of a gap structure 111 located in the non-contact region Q2 is greater than an area of a cross section of a gap structure 111 located in the electrode contact regions Q1. The cross section is perpendicular to an extension direction of a respective gap structure 111.

It will be noted that, by such a design, in a case where gap structures 111 in the electrode contact regions Q1 are same as gap structures 111 in the non-contact region Q2 in number and dimension in an extension direction thereof, and the area of the cross section of the gap structure 111 in the non-contact region Q2 is greater than the area of the cross section of the gap structure 111 in the non-contact region Q2, the volume of the gap structures 111 provided in the non-contact region Q2 may be greater than the volume of the gap structures 111 provided in the electrode contact regions Q1. In this way, the non-contact region Q2 has a larger space for overflow of the adhesive solution, which may ensure that the adhesive solution in both the electrode contact regions Q1 and the non-contact region Q2 effectively overflow.

For example, with reference to FIG. 6, each electrode contact region Q1 and a non-contact region Q2 between two electrode contact regions Q1 are both provided therein with gap structures 111 (i.e., clearance grooves 111a), and the area of the cross section of the gap structure 111 provided in the non-contact region Q2 is greater than the area of the cross section of the gap structure 111 disposed in the electrode contact regions Q1. Therefore, the non-contact region Q2 has a larger space for overflow of the adhesive solution.

In some embodiments, the plurality of gap structures 111 include at least one clearance groove 111a, and the at least one clearance groove 111a is located on a side of the first film layer 11 proximate to the conductive particle layer 12 and/or a side of the first film layer 11 away from the conductive particle layer 12.

It will be noted that, whether the clearance groove 111a is disposed on the side of the first film layer 11 proximate to the conductive particle layer 12, the side of the first film layer 11 away from the conductive particle layer 12, or both the side of the first film layer 11 proximate to the conductive particle layer 12 and the side of the first film layer 11 away from the conductive particle layer 12, the clearance groove 111a may always increase a space for overflow of the adhesive solution, which is beneficial for the adhesive solution to overflow sufficiently and is conductive to reducing the risk of weak pressure between the raised electrodes to be bonded.

In some examples, with reference to FIGS. 8 to 12, a plurality of clearance grooves 111a are located on the side of the first film layer 11 proximate to the conductive particle layer 12, and an extension direction of the clearance grooves 111a is parallel to a plane where the first film layer 11 is located. By such a design, the clearance grooves 111a are proximate to the conductive particle layer 12, and then the conductive particle layer may also flow into the clearance grooves 111a when the conductive adhesive film 1 is pressed. Therefore, a contact rate of conductive particles 121 at positions where the clearance grooves 111a are located is improved. In a case where the clearance grooves 111a are disposed corresponding to the raised electrodes to be bonded, a contact rate of conductive particles 111a between upper raised electrodes and lower raised electrodes (i.e., the first raised electrodes 1011 and the second raised electrodes 1021) may be improved, which ensures reliable bonding of the raised electrodes.

In some other examples, the clearance grooves 111a may be located on the side of the first film layer 11 away from the conductive particle layer 12.

In some other examples, the extension direction of the clearance grooves 111a may be set in the direction perpendicular to the first film layer 11.

In some embodiments, a section of at least one clearance groove 111a in a plane perpendicular to an extension direction of the at least one clearance groove 111a is in a shape of a rectangle, a trapezoid or a U-shape.

Figure 8:
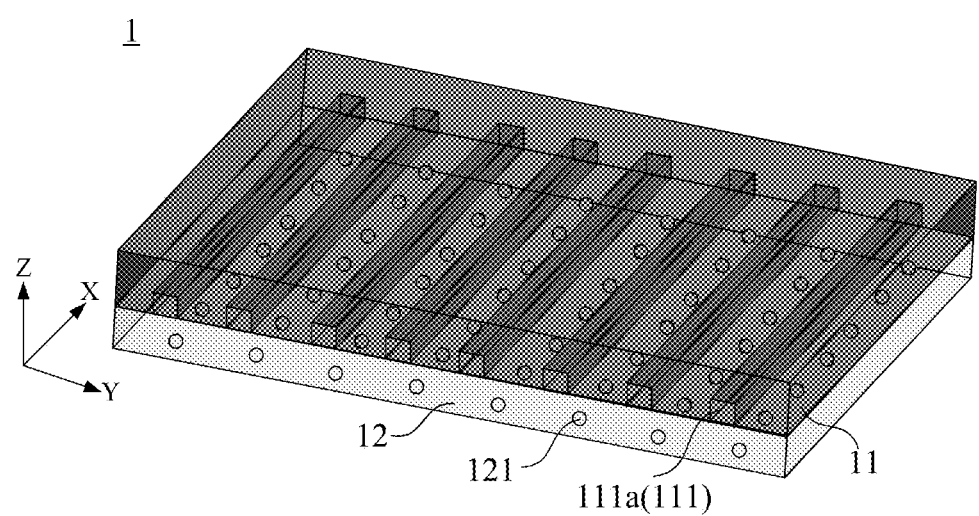
FIG. 8 is a diagram showing a structure of a conductive adhesive film, in accordance with some embodiments.
Figure 9:
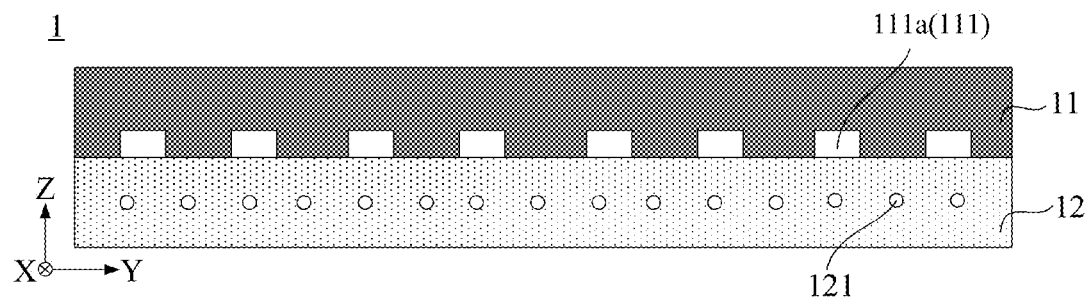
FIGS. 9 to 12 are each a diagram showing a structure of a conductive adhesive film in the direction X, in accordance with some embodiments.

In some examples, with reference to FIGS. 8 and 9, the section of the clearance groove 111a in the plane perpendicular to the extension direction of the clearance groove 111a is in a shape of a rectangle.

Figure 10:
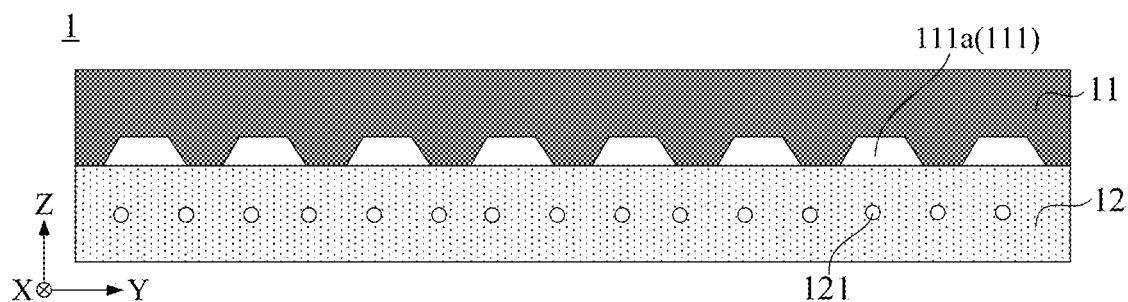

In some other examples, with reference to FIG. 10, sections of a plurality of clearance grooves 111a in a plane perpendicular to an extension direction (i.e., a direction X) of the clearance grooves 111a are all in a shape of a trapezoid. For example, the sections of the clearance grooves 111a in the plane perpendicular to the extension direction (i.e., the direction X) of the clearance grooves 111a are in a shape of an upright isosceles trapezoid.

Figure 11:
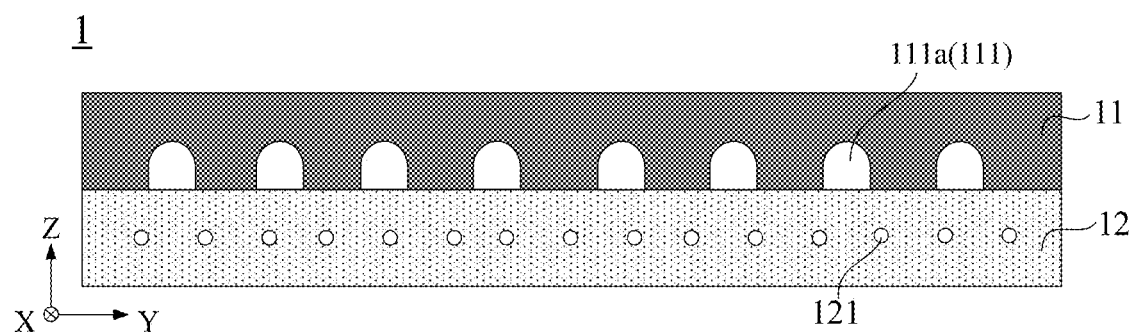

In yet some other embodiments, with reference to FIG. 11, the clearance grooves 111a in the plane perpendicular to the extension direction (i.e., the direction X) of the clearance grooves 111a are all in a shape of an inverted U-shape.

It will be noted that, the shape of the section of the clearance groove 111a in the plane perpendicular to the extension direction (i.e., the X direction) of the clearance groove 111a is not specifically limited in embodiments of the present disclosure. In some other examples, the shape of the section of the clearance groove 111a in the plane perpendicular to the extension direction (i.e., the X direction) of the clearance groove 111a may be a semicircle, a regular polygon or other shapes. In addition, in a case where the first film layer 11 has the plurality of clearance grooves 111a, shapes of sections of the plurality of clearance grooves 111a in the plane perpendicular to the extension direction (i.e., the X direction) of the clearance grooves 111a may be same or different.

In some embodiments, the clearance groove 111a is a through groove extending in the direction parallel to the first film layer 11.

With reference to FIGS. 8 to 12, the clearance groove 111a is set as a through-groove structure, which facilitates processing. In addition, all of adhesive solution in the extension direction of the clearance groove 111a may flow into the clearance groove 111a, which may ensure that adhesive solution at different positions in the extension direction of the clearance groove 111a flows uniformly.

Figure 12:
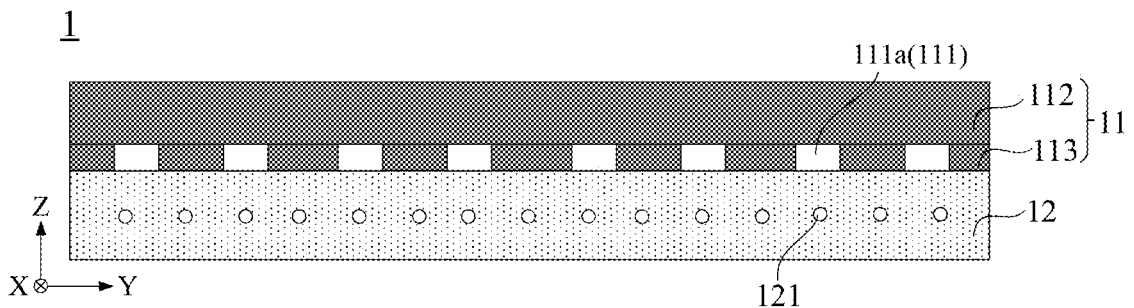

In some embodiments, with reference to FIG. 12, the first film layer 11 includes: a first base material 112 and a plurality of first film blocks 113. The plurality of first film blocks 113 are disposed on a side of the first base material 112. Two adjacent first film blocks 113 and the first base material 112 provide a clearance groove 111a of the at least one clearance grooves 111a together.

With reference to FIG. 12, the first film layer 11 adopts a combined structure of the film blocks in a shape of a block and the base material in a shape of a sheet, and may be formed by layer-by-layer attachment. A size of the clearance groove 111a may be adjusted by adjusting an interval between the first film blocks 113 and a height of the first film blocks 113. Moreover, it may be possible to obtain the clearance groove 111a with a different sectional shape by using the first base material 112 with a surface of a different shape and the first film blocks 113 with side surfaces of a different shape.

In some embodiments, with reference to FIGS. 13 to 17, the plurality of gap structures 111 include at least one clearance hole 111b, and an axis of the at least one clearance hole 111b is parallel to the first film layer 11.

It will be noted that, in a case where the gap structure 111 adopts a clearance hole 111b, adhesive solution in the first film layer 11 may enter the clearance hole 111b through both ends thereof during flowing. Therefore, a space for overflow of the adhesive solution is increased, which is beneficial for the adhesive solution to overflow sufficiently and conductive to improving the adhesive-overflowing uniformity.

In some examples, with reference to FIGS. 13 to 17, the axis of the clearance hole 111b is parallel to the first film layer 11 and in the X direction. In some other examples, the axis of the clearance hole 111b may be perpendicular to the first film layer 11. That is, the axis of the clearance hole 111b may be in the Z direction.

In some embodiments, a section of at least one clearance hole 111b in a plane perpendicular to a direction of the axis of the at least one clearance hole 111b is in a shape of a circle, an ellipse or a rectangle.

Figure 13:
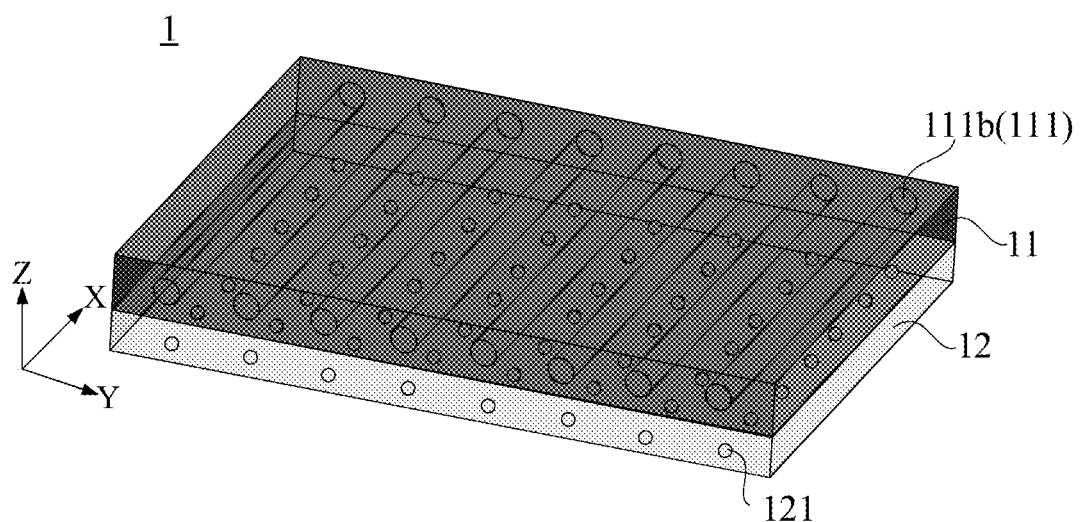
FIG. 13 is a diagram showing a structure of another conductive adhesive film, in accordance with some embodiments.
Figure 14:
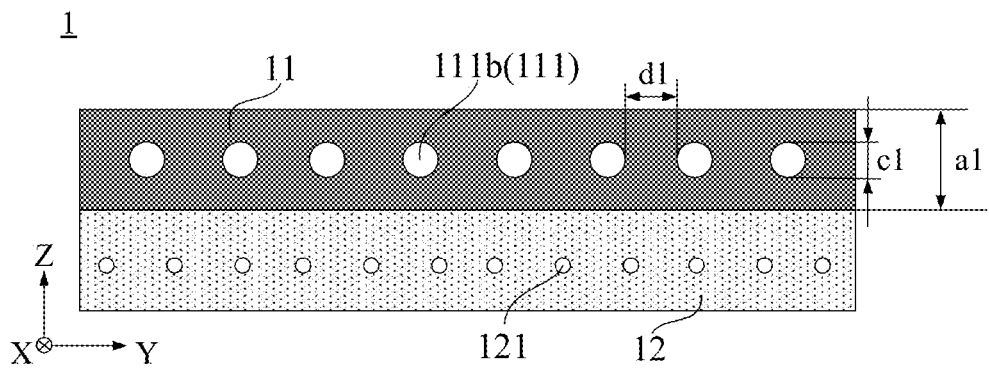
FIGS. 14 to 17 are each a diagram showing a structure of another conductive adhesive film in the direction X, in accordance with some embodiments.

In some examples, with reference to FIGS. 13 and 14, sections of a plurality of clearance holes 111b in a plane perpendicular to a direction (i.e., the X direction) of axises of the clearance holes 111b are all in a shape of a circle.

Figure 15:
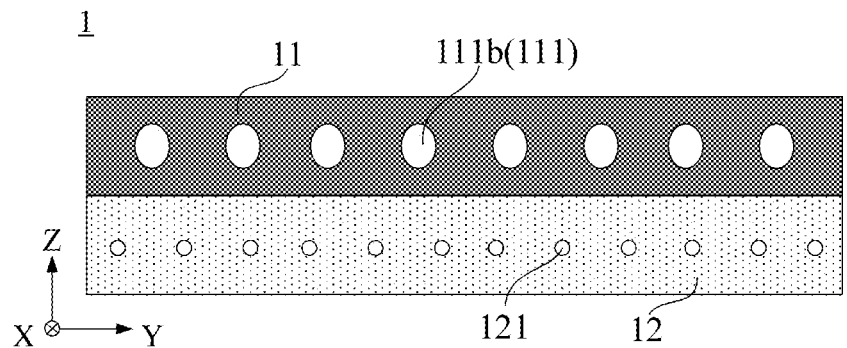

In some other examples, with reference to FIG. 15, the sections of the plurality of clearance holes 111b in the plane perpendicular to the direction (i.e., the X direction) of the axises of the clearance holes 111b are all in a shape of a ellipse, and a long axis of the ellipse is perpendicular to the first film layer 11 (i.e., the Z direction).

Figure 16:
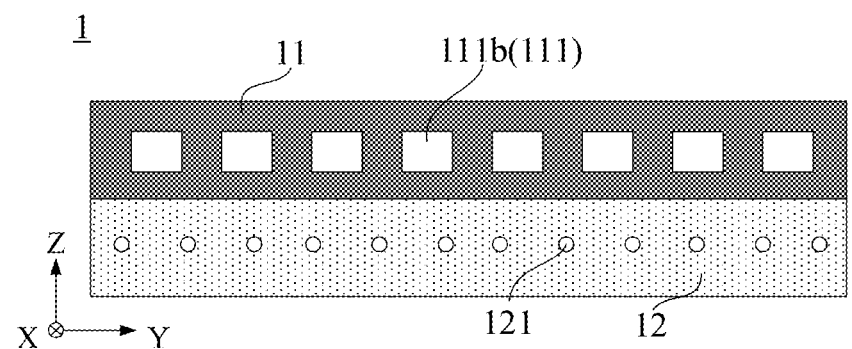
Figure 17:
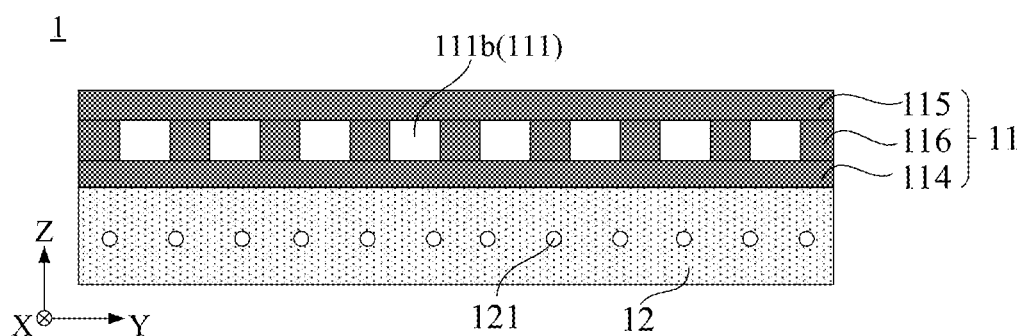

In yet some other examples, with reference to FIGS. 16 and 17, the sections of the plurality of clearance holes 111b in the plane perpendicular to the direction (i.e., the X direction) of the axises of the clearance holes 111b are all in a shape of a rectangle.

It will be noted that, the shape of the section of the clearance hole 111b in the plane perpendicular to the extension direction (i.e., the X direction) of the clearance hole 111b is not specifically limited in embodiments of the present disclosure. In some other examples, the shape of the section of the clearance hole 111b in the plane perpendicular to the extension direction (i.e., the X direction) of the clearance hole 111b may be a semicircle, a regular polygon, a trapezoid or other shapes. In a case where the first film layer 11 has the plurality of clearance holes 111b, shapes of sections of the plurality of clearance holes 111b in a plane perpendicular to an extension direction (i.e., the X direction) of the clearance holes 111b may be same or different.

In some embodiments, the clearance hole 111b is a through hole.

With reference to FIGS. 13 to 17, the axis of the clearance hole 111b is parallel to the first film layer 11, and the clearance hole 111b adopts a through hole. In this way, it is beneficial to improve the adhesive-overflowing uniformity at different positions in an extension direction (i.e., the X direction) of the hole.

In some embodiments, with reference to FIG. 17, the first film layer 11 includes: a second base material 114, a third base material 115 and a plurality of second film blocks 116. The plurality of second film blocks 116 are disposed between the second base material 114 and the third film block 116. Two adjacent second film blocks 116, the second base material 114 and the third base material 115 provide a clearance hole 111b of the at least one clearance hole 111b together.

With reference to FIG. 17, the first film layer 11 adopts a combined structure of the film blocks in a shape of a block and the base materials in a shape of a sheet, and may be fabricated by layer-by-layer attachment. A size of the clearance hole 111b may be adjusted by adjusting an interval between the second film blocks 116 and a height of the second film blocks 116. Moreover, it may be possible to obtain the clearance hole 111b with a different sectional shape by adopting the base materials with surfaces of a different shape and the film blocks with side surfaces of a different shape.

In some embodiments, the plurality of gap structures 111 extend in a first direction and are sequentially arranged in a second direction. The first direction is perpendicular to the second direction, and the first direction and the second direction are both parallel to the first film layer 11.

With reference to FIGS. 8 to 17, the plurality of gap structures 111 extend in the X direction (i.e., the first direction) and are arranged in the Y direction (i.e., the second direction). By such a design, it may be possible to improve the adhesive-overflowing uniformity of the entire conductive adhesive film 1 at different positions. In addition, the gap structures 111 are arranged regularly, which facilitates processing and fabrication.

Figure 18:
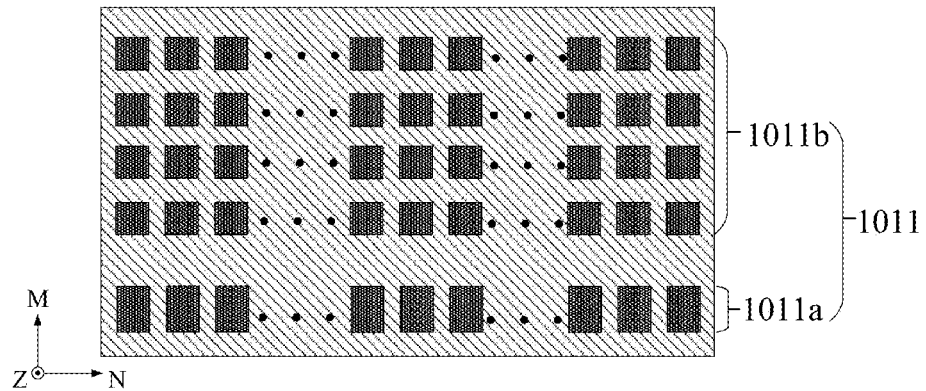
FIG. 18 is a diagram showing a structure of a substrate in the direction Z, in accordance with some embodiments.

In some embodiments, with reference to FIG. 18, in the electronic device 10, the plurality of first raised electrodes 1011 are arranged in a plurality of rows and a plurality of columns. First raised electrodes 1011 in the first row are input electrodes 1011a, and first raised electrodes 1011 in the remaining rows are output electrodes 1011b. A distance between the input electrodes 1011a and an adjacent row of output electrodes 1011b is greater than a distance between two adjacent rows of output electrodes 1011b. The plurality of gap structures 111 of the conductive adhesive film 1 extend in a row direction or a column direction of the plurality of first raised electrodes 1011.

With reference to FIGS. 1, 2 and 18, the first raised electrodes 1011 are arranged in the plurality of rows in the M direction and the plurality of columns in the N direction. First raised electrodes 1011 in a row furthest from the display region 1031 are the input electrodes 1011a.

In some examples, with reference to FIG. 1, the clearance holes 111b in the conductive adhesive film 1 extend in the row direction (i.e., the N direction) of the first raised electrodes 1011, and are arranged in the column direction (i.e., the M direction) of the first raised electrodes 1011).

In some other examples, with reference to FIG. 2, the gap structures 111 extend in the column direction (i.e., the M direction) of the first raised electrodes 1011, and are arranged in the row direction (i.e., the N direction) of the first raised electrodes 1011.

In some embodiments, with reference to FIGS. 14 and 19 to 23, a maximum dimension of at least one gap structure 111 of the plurality of gap structures 111 in a third direction (i.e., the Z direction) is c1, and a dimension of the first film layer 11 in the third direction (i.e., the Z direction) is a1. The third direction is perpendicular to the first film layer 11. c1 and a1 satisfy: c1 is equal to k0 times a1 (c1=k0×a1), where k0 is greater than or equal to 20% and less than or equal to 30% (20%≤k0≤30%). For example, c1 is equal to 20% times a1 (c1=20%×a1), c1 is equal to 25% times a1 (c1=25%×a1), or c1 is equal to 30% times a1 (c1=30%×a1).

Figure 19:
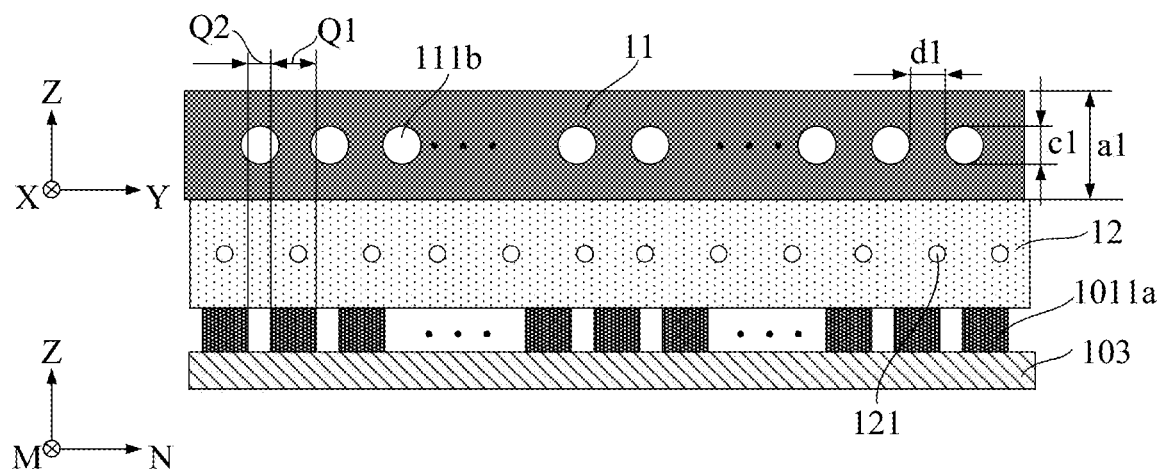
FIGS. 19 to 23 are each a diagram showing a structure where a conductive adhesive film is disposed on a substrate, in accordance with some embodiments.
Figure 20:
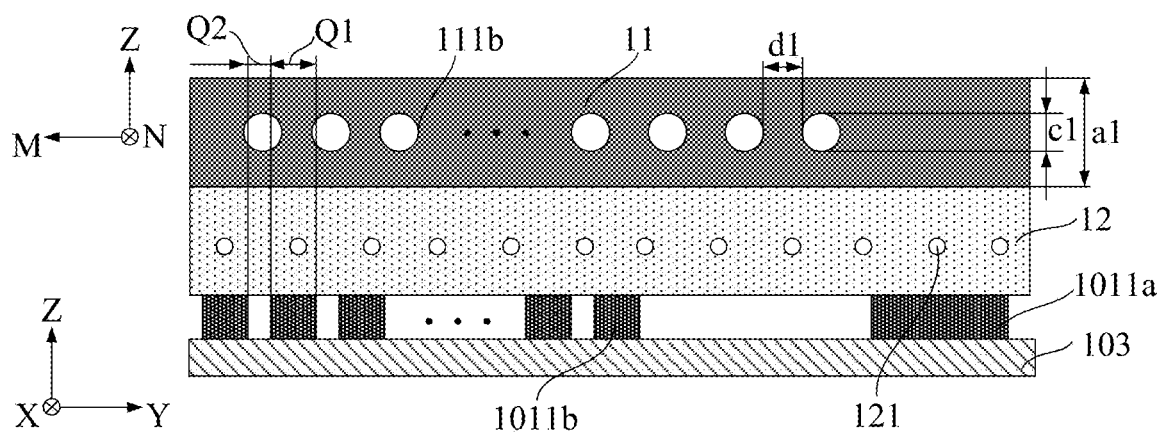

With reference to FIGS. 19 and 20, the gap structures 111 adopt circular clearance holes 111b of a same size. In a case where the maximum dimension c1 of the clearance hole 111b in the third direction (i.e., the Z direction) and the dimension a1 in the third direction (i.e., the Z direction) satisfy the above relationship, it may be possible to ensure that, the gap structures 111 may have enough gaps to provide spaces for overflow of the adhesive solution, and an porosity of the first film layer 11 is not too large, which avoids collapse of the first film layer 11.

In some examples, with reference to FIG. 19, the gap structures 111 adopt the circular clearance holes 111b, and the plurality of clearance holes 111b extend in the column direction (i.e., the M direction) of the first raised electrodes 1011 and are uniformly arranged in the row direction (i.e., the N direction) of the first raised electrodes 1011. The maximum dimension c1 of the clearance hole 111b in the third direction (i.e., the Z direction) is a diameter of the clearance hole 111b.

In some other examples, with reference to FIG. 20, the gap structures 111 adopt the circular clearance holes 111b, and the plurality of clearance holes 111b extend in the row direction (i.e., the N direction) of the first raised electrodes 1011 and are uniformly arranged in the column direction (i.e., the M direction) of the first raised electrodes 1011. The maximum dimension c1 of the clearance hole 111b in the third direction (i.e., the Z direction) is a diameter of the clearance hole 111b.

In some embodiments, with reference to FIGS. 14 and 19 to 23, a first distance d1 exists between two adjacent gap structures 111, and d1 satisfies: d1 is equal to k1 times c1 (d1=k1×c1), where k1 is greater than or equal to 2 and less than or equal to 3 (2≤k1≤3). For example, d1 is equal to 2 times c1 (d1=2×c1), d1 is equal to 2.5 times c1 (d1=2.5×c1), or d1 is equal to 3 times c1 (d1=3×c1).

With reference to FIGS. 19 and 20, the first distance d1 between the two clearance holes 111b refers to a minimum distance between the two clearance holes 111b. In a case where the first distance d1 between the two clearance holes 111b satisfies the above requirement, the distance between the two clearance holes 111b may be neither too large nor too small. Therefore, it is ensured that the gap structures 111 are uniformly distributed, which facilitates processing and may ensure the adhesive-overflowing uniformity.

Figure 21:
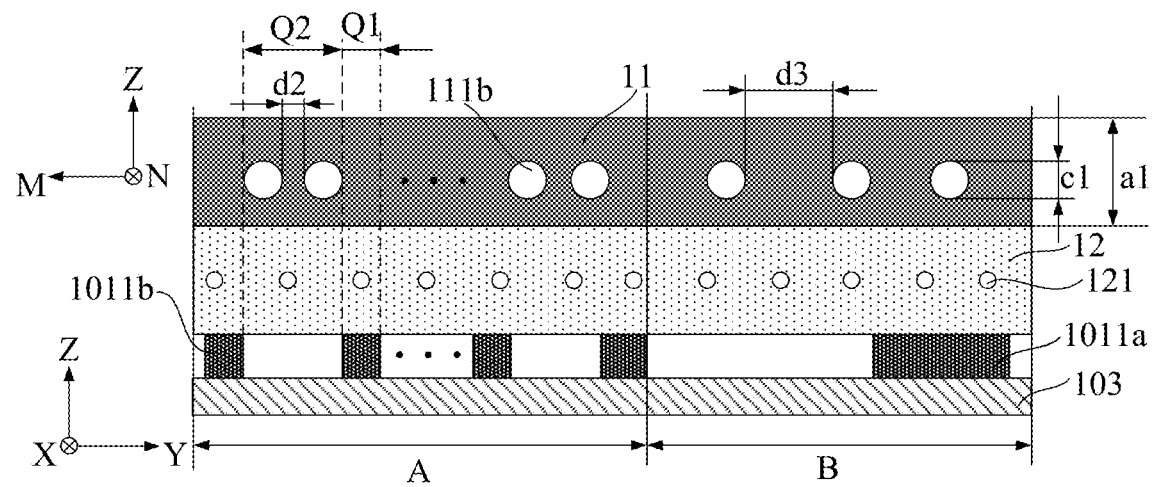

In some embodiments, with reference to FIG. 21, the first film layer 11 includes a first region A and a second region B that are sequentially arranged in the second direction (i.e., the Y direction). Within the first region A, a second distance d2 exists between two adjacent gap structures 111; and within the second region B, a third distance d3 exists between two adjacent gap structures 111. d2 and d3 satisfy the following relationships. d2 is equal to k2 times c1 (d2=k2×c1), where k2 is greater than or equal to 2 and less than or equal to 3 (2≤k2≤3). For example, d2 is equal to 2 times c1 (d2=2×c1), d2 is equal to 2.5 times c1 (d2=2.5×c1), or d2 is equal to 3 times c1 (d2=3×c1). d3 is equal to k3 times c1 (d3=k3×c1), where k3 is greater than or equal to 4 and less than or equal to 6 (4≤k3≤6). For example, d3 is equal to 4 times c1 (d3=4×c1), d3 is equal to 5 times c1 (d3=5×c1), or d3 is equal to 6 times c1 (d3=6×c1).

By such a design, the gap structures 111 may have different arrangement densities in different regions, so that the different regions have different spaces for overflow of the adhesive solution. This is conductive to adjusting an adhesive-overflowing situation in each region, thereby ensuring the adhesive-overflowing uniformity in all regions.

In some examples, with reference to FIG. 21, the gap structures 111 adopt a plurality of circular clearance holes 111b, and the plurality of clearance holes 111b extend in the row direction (i.e., the N direction) of the first raised electrodes 1011 and arranged in the column direction (i.e., the M direction) of the first raised electrodes 1011. The first region A corresponds to the output electrodes 1011b, and the second region B corresponds to the input electrodes 1011a. The distance between two adjacent rows of output electrodes 1011b is less than the distance between the input electrodes 1011a and an adjacent row of output electrodes 1011b. That is to say, in the first region A, an arrangement density of first raised electrodes 1011 is greater, and a space for overflow of the adhesive solution is smaller. Therefore, by setting the distance between the clearance holes 111b in the first region A to be less than the distance between the clearance holes 111b in the second region B (i.e., d2<d3), it may be possible to ensure a larger arrangement density of the clearance holes 111b in the first region A, so that the first region A has a large space for overflow of the adhesive solution. Therefore, it is ensured that the adhesive solution in both the first region A and the second region B may overflow effectively, so that the adhesive-overflowing uniformity at different positions in all regions is improved.

Figure 22:
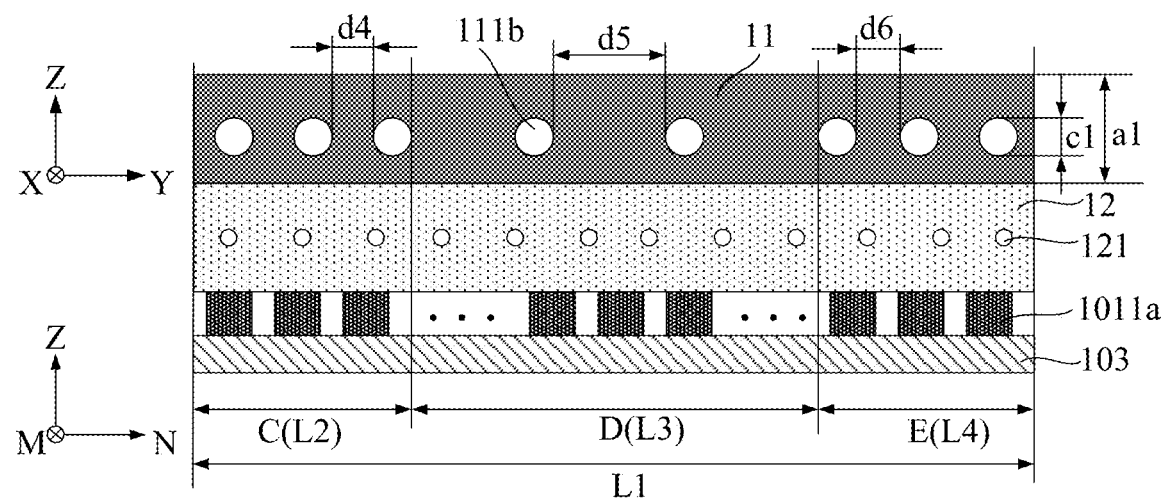
Figure 23:
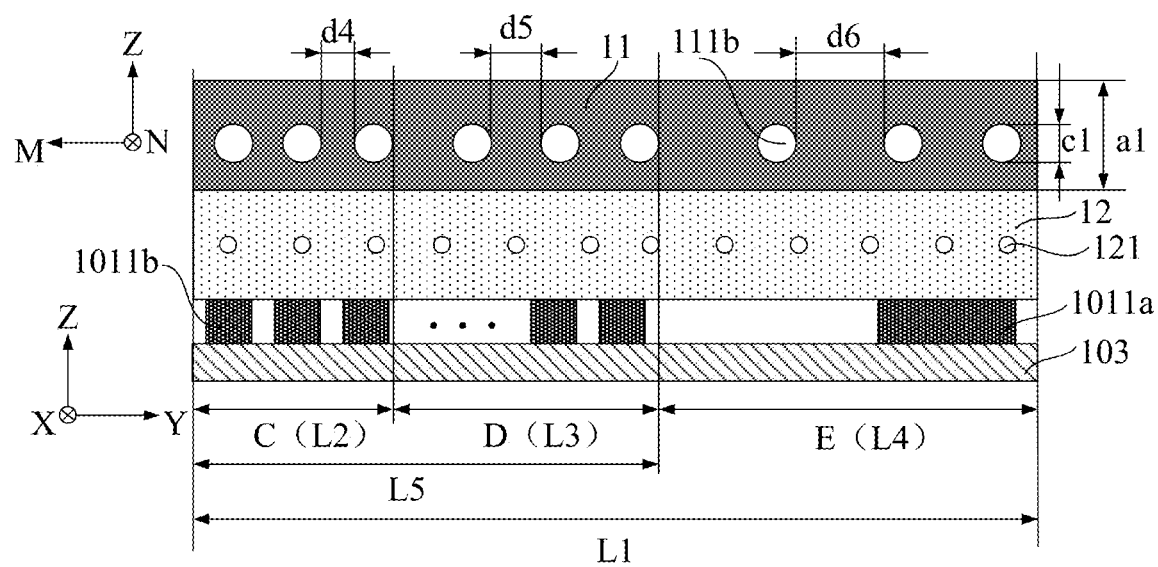

In some embodiments, with reference to FIGS. 22 and 23, the first film layer 11 includes a third region C, a fourth region D and a fifth region E that are sequentially arranged in the second direction (i.e., the Y direction). Within the third region C, a fourth distance d4 exists between two adjacent gap structures 111, within the fourth region D, a fifth distance d5 exists between two adjacent gap structures 111, and within the fifth region E, a sixth distance d6 exists between two adjacent gap structures 111. In some examples, with reference to FIGS. 22, d4, d5 and d6 satisfy the following relationships. d4 and d6 are each equal to k4 times c1 (d4=d6=k4×c1), where k4 is greater than or equal to 1 and less than or equal to 1.5 (1≤k4≤1.5). For example, d4 and d6 are each equal to c1 (d4=d6=c1), d4 and d6 are each equal to 1.2 times c1 (d4=d6=1.2×c1), or d4 and d6 are each equal to 1.5 times c1 (d4=d6=1.5×c1). d5 is equal to k5 times c1 (d5=k5×c1), where k5 is greater than or equal to 4 and less than or equal to 6 (4≤k5≤6). For example, d5 is equal to 4 times c1 (d5=4×c1), d5 is equal to 5 times c1 (d5=5×c1), or d5 is equal to 6 times c1 (d5=6×c1). In some other examples, with reference to FIGS. 23, d4, d5 and d6 satisfy the following relationships. d4 is equal to k6 times c1 (d4=k6×c1), where k6 is greater than or equal to 1 and less than or equal to 1.5 (1≤k6≤1.5). For example, d4 is equal to c1 (d4=c1), d4 is equal to 1.3 times c1 (d4=1.3×c1), or d4 is equal to 1.5 times c1 (d4=1.5×c1). d5 is equal to k7 times c1 (d5=k7×c1), where k7 is greater than or equal to 2 and less than or equal to 3 (2≤k7≤3). For example, d5 is equal to 2 times c1 (d5=2×c1), d5 is equal to 2.3 times c1 (d5=2.3×c1), or d5 is equal to 3 times c1 (d5=3×c1). d6 is equal to k8 times c1 (d6=k8×c1), where k8 is greater than or equal to 4 and less than or equal to 6 (4≤k8≤6). For example, d6 is equal to 4 times c1 (d6=4×c1), d6 is equal to 4.5 times c1 (d6=4.5×c1), or d6 is equal to 6 times c1 (d6=6×c1).

By such a design, different regions may have different numbers of gap structures 111. That is, the gap structures 111 have different arrangement densities in the different regions. Therefore, the different regions have different spaces for overflow of the adhesive solution, which is beneficial to improve the adhesive-overflowing uniformity in all regions.

In some examples, with reference to FIG. 22, the gap structures 111 adopt a plurality of circular clearance holes 111b, and the plurality of clearance holes 111b extend in the column direction (i.e., the M direction) of the first raised electrodes 1011, and are arranged in the row direction (i.e., the N direction) of the first raised electrodes 1011. In the row direction (i.e., the N direction) of the first raised electrodes 1011, adhesive solution in the fourth region D overflows towards the third region C and the fifth region E on both sides of the fourth region D respectively. Therefore, the third region C and the fifth region E need larger spaces for overflow of the adhesive solution than the fourth region D. In a case where d4 and d6 are equal, which are less than d4 (d4=d6<d5), more clearance holes 111b may be provided in the third region C and the fifth region E, so that the third region C and the fifth region E have larger spaces for overflow of the adhesive solution, and then the adhesive solution in the third region C and the fifth region E may effectively overflow. Therefore, adhesive-overflowing uniformity in the third region C, the fourth region D and the fifth region E is ensured.

In some other examples, with reference to FIG. 23, the gap structures 111 adopt a plurality of circular clearance holes 111b, and the plurality of clearance holes 111b extend in the row direction (i.e., the N direction) of the first raised electrodes 1011, and are arranged in the column direction (i.e., the M direction) of the first raised electrodes 1011. The third region C, the fourth region D and the fifth region E are arranged along a direction from the output electrodes 1011b to the input electrodes 1011a. In the column direction (i.e., the M direction) of the first raised electrodes 1011, since the distance between the input electrodes 1011a and the adjacent row of output electrodes 1011b is greater than the distance between the adjacent row of output electrodes 1011b, and distances between adjacent row of output electrodes 1011b are equal to each other, a space for overflow of the adhesive solution at a side away from the input electrodes 1011a is smaller. Therefore, the farther away from the input electrodes 1011a the position is, the smaller the space for overflow of the adhesive solution in the first film layer 11 is. In this way, in a case where d4 is less than d5, and d5 is less than d6 (d4<d5<d6), spaces for overflow of the adhesive solution in the first film layer 11 along the fifth region E to the third region C may be increased in sequence, which ensures overall adhesive-overflowing uniformity in the third region C, the fourth region D and the fifth region E.

In some embodiments, with reference to FIGS. 22 and 23, a length of the first film layer 11 in the second direction (i.e., the Y direction) is L1, a length of the third region C in the second direction (i.e., the Y direction) is L2, a length of the fourth region D in the second direction (i.e., the Y direction) is L3, a length of the fifth region E in the second direction (i.e., the Y direction) is L4, and a sum of lengths of the third region C and the fourth region D in the second direction (i.e., the Y direction) is L5. In some examples, with reference to FIG. 22, in a case where d4, d5 and d6 satisfy: d4=d6=k4×c1, where 1≤k4≤1.5, and d5=k5×c1, where 4≤k5≤6, L1, L2, L3 and L4 satisfy the following relationships. L3 is equal to K9 times L1 (L3=k9×L1), where k9 is greater than or equal to 40% and less than or equal to 60%(40%≤k9≤60%). For example, L3 is equal to 40% times L1 (L3=40%×L1), L3 is equal to 50% times L1 (L3=50%×L1), or L3 is equal to 60% times L1 (L3=60%×L1). A sum of L2 and L4 is equal to k10 times L1 (L2+L4=k10×L1), where k10 is greater than or equal to 40% and less than or equal to 60%(40%≤k10≤60%). For example, in a case where L3=40%×L1, the sum of L2 and L4 is equal to 60% times L1 (L2+L4=60%×L1); in a case where L3=50%×L1, the sum of L2 and L4 is equal to 50% times L1 (L2+L4=50%×L1); or in a case where L3=60%×L1, the sum of L2 and L4 is equal to 40% times L1 (L2+L4=40%×L1). L2=L4. In some other examples, with reference to FIG. 23, in a case where d4, d5 and d6 satisfy: d4=k6×c1, where 1≤k6≤1.5, d5=k7×c1, where 2≤k7≤3, and d6=k8×c1, where 4≤k8≤6, L2, L3 and L5 satisfy the following relationships. L2 is equal to K11 times L5 (L2=k11×L5), where k11 is greater than or equal to 40% and less than or equal to 60% (40%≤k11≤60%). For example, L2 is equal to 40% times L5 (L2=40%×L5), L2 is equal to 50% times L5 (L2=50%×L5), or L2 is equal to 60% times L5 (L2=60%×L5). L3 is equal to K12 times L5 (L3=k12×L5), where k12 is greater than or equal to 40% and less than or equal to 60%(40%≤k12≤60%). For example, in a case where L2=40%×L5, L3 is equal to 60% times L5 (L3=60%×L5); in a case where L2=50%×L5, L3 is equal to 50% times L5 (L3=50%×L5); or in a case where L2=60%×L5, L3 is equal to 40% times L5 (L3=40%×L5).

By such a design, numbers of gap structures 111 in different regions may be adjusted by adjusting the lengths of the different regions, thereby adjusting sizes of spaces for overflow of the adhesive solution in the different regions, which is beneficial to ensure the adhesive-overflowing uniformity in all regions.

In some examples, with reference to FIG. 22, in the row direction (i.e., the N direction) of the first raised electrodes 1011, adjacent first raised electrodes 1011 are uniformly arranged. The relationships that L3=k9×L1, where 40%≤k9≤60%, L2+L4=k10×L1, where 40%≤k10≤60%, and L2=L4 mean that: a sum of lengths of the third region C and the fifth region E is equal to the length of the fourth region D, and the length of the third region C is equal to the length of the fifth region E. By such a design, it may be possible to ensure structural symmetry of the conductive adhesive film, so that spaces on both sides are equal to each other, which is beneficial to improve the adhesive-overflowing uniformity.

In some other examples, with reference to FIG. 23, the relationships that L2=k11×L5, where 40%≤k11≤60%, and L3=k12×L5, where 40%≤k12≤60% mean that, the length of the third region C and the length of the fourth region D are equal to each other. By such a design, it may be possible to ensure good adhesive-overflowing uniformity within the regions where the output electrodes 1011b are located. A relationship between the length of the fifth region E and the sum of the lengths of the third region C and the fourth region D is not specifically limited, which may be determined depending on the distance between the input electrodes 1011a and the adjacent row of output electrodes 1011b.

It will be noted that, any one of the first region A, the second region B, the third region C, the fourth region D and the fifth region E may include both electrode contact regions Q1 and a portion of the non-contact region Q2. On this basis, a distance between two adjacent gap structures 111 in the non-contact region Q2 may still be greater than a distance between two adjacent gap structures 111 in the electrode contact region Q1.

Figure 24:
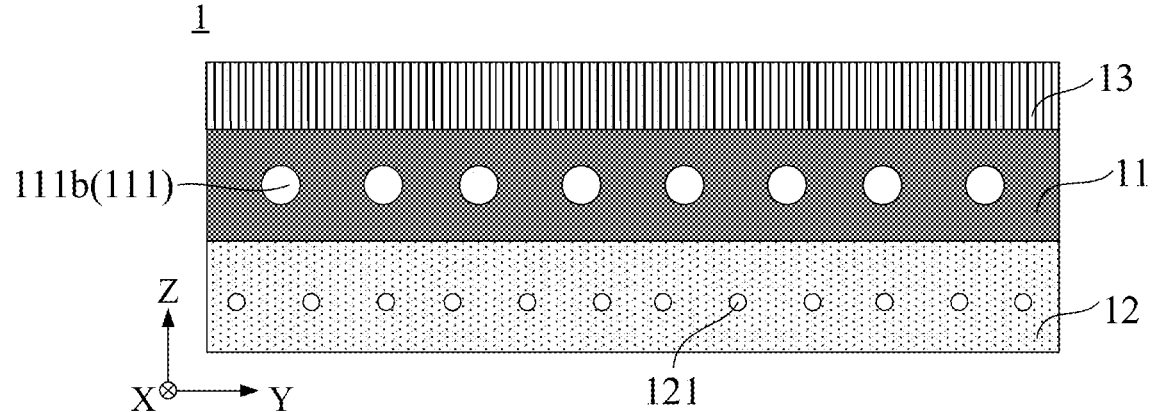
FIG. 24 is a diagram showing a structure of yet another conductive adhesive film, in accordance with some embodiments.

In some embodiments, with reference to FIG. 24, the conductive adhesive film 1 further includes: a second film layer 13. The second film layer 13 is releasably attached to the side of the first film layer 11 away from the conductive particle layer 12.

By providing the second film layer 13, the first film layer 11 may be protected from being contaminated or damaged.

In some examples, with reference to FIG. 24, the second film layer 13 is a release film. In a case where the conductive adhesive film 1 is not in use, the second film layer 13 may be attached to the first film layer 11 to play a good role in protecting the first film layer 11; and in a case where the conductive adhesive film 1 is in use, the second film layer 13 may be removed.

Figure 25:
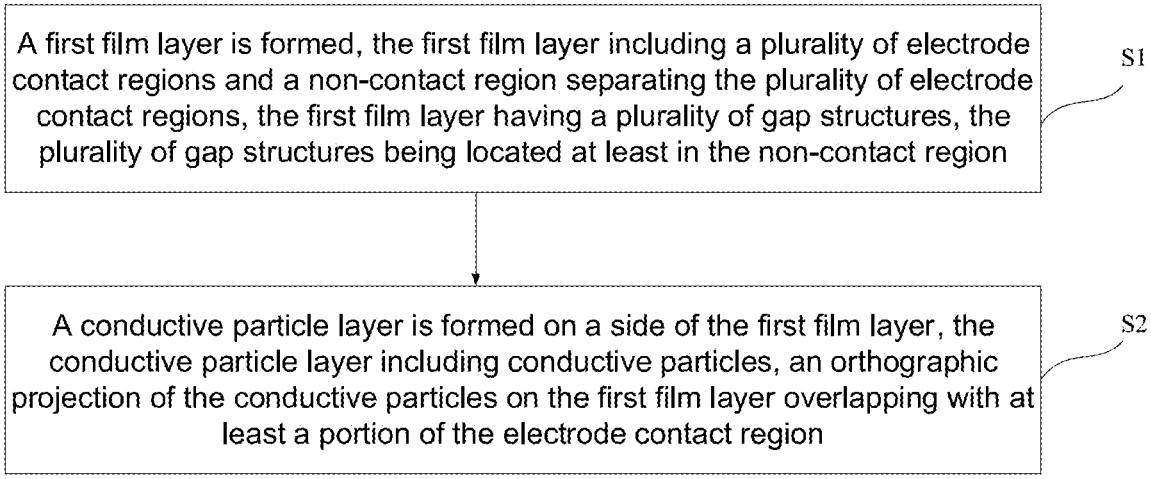
FIG. 25 is a flowchart of a method for fabricating a conductive adhesive film, in accordance with some embodiments.

Some embodiments of the present disclosure provide a method for fabricating a conductive adhesive film. The method is used for fabricating the conductive adhesive film 1 described in any one of the above embodiments. With reference to FIG. 25, the method includes steps S1 and S2.

Figure 26:
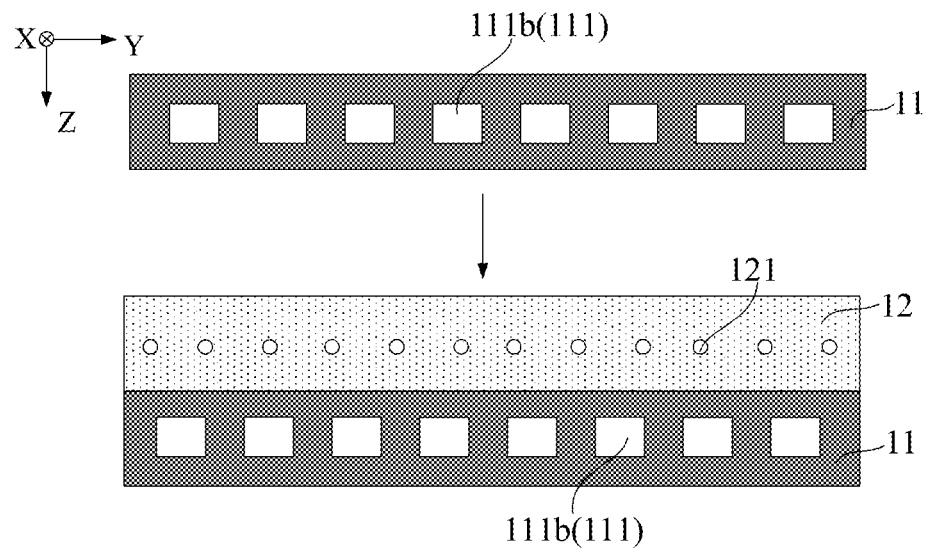
FIG. 26 is a diagram showing steps for fabricating a conductive adhesive film, in accordance with some embodiments.

In S1, with reference to FIG. 26, the first film layer 11 is formed. With reference to FIGS. 4 to 6, the first film layer 11 includes the plurality of electrode contact regions Q1 and the non-contact region Q2 separating the plurality of electrode contact regions Q1. The first film layer 11 has the plurality of gap structures 111. The plurality of gap structures 111 are located at least in the non-contact region Q2.

In this step, with reference to FIGS. 8 to 17, the gap structures 111 may be formed by defining the clearance grooves 111a or the clearance holes 111b in the first film layer 11. With reference to FIG. 26, in this example, sections of the clearance holes 111b disposed in the first film layer 11 in a direction perpendicular to axes of the clearance holes 111b are rectangular, and the plurality of clearance holes 111b are arranged at equal intervals.

In S2, with reference to FIG. 26, the conductive particle layer 12 is formed on the side of the first film layer 11. The conductive particle layer 12 includes the conductive particles 121. The orthographic projection of the conductive particles 121 on the first film layer 11 overlaps with the at least a portion of the electrode contact region Q1.

In this step, the conductive particle layer 12 may be provided on the side of the first film layer 11 by a coating process.

In some examples, the gap structures 111 may be formed in the first film layer 11 first, and then the conductive particle layer 12 is formed on the side of the first film layer 11. In some other examples, it may be possible to form the conductive particle layer 12 on the side of the first film layer 11 first, and then define the gap structures 111s in the first film layer 11.

Figure 27:
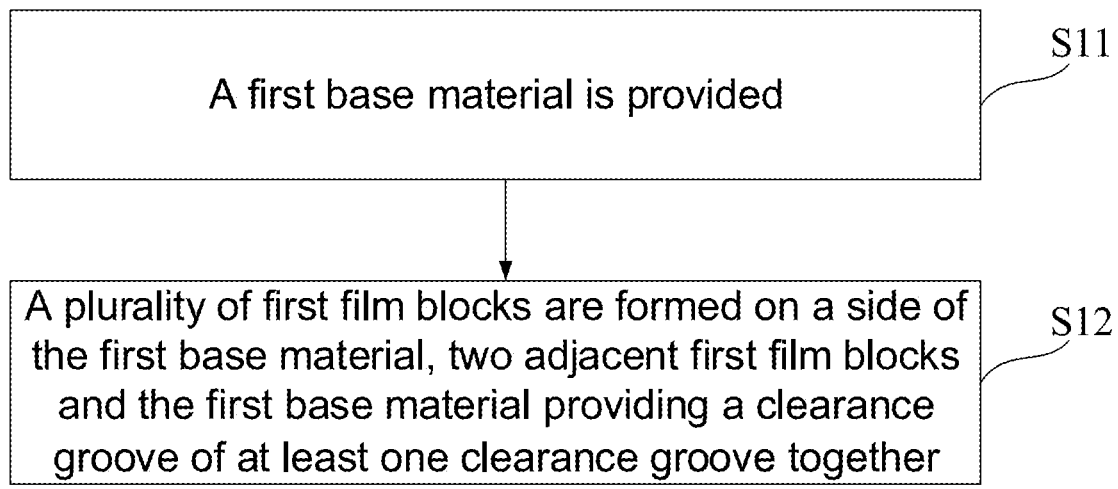
FIG. 27 is a flowchart of another method for fabricating a conductive adhesive film, in accordance with some embodiments.

In some embodiments, with reference to FIGS. 8 to 12, the plurality of gap structures 111 includes a plurality of clearance grooves 111a. With reference to FIG. 27, the step of forming the first film layer 11 includes steps S11 to S12.

Figure 28:
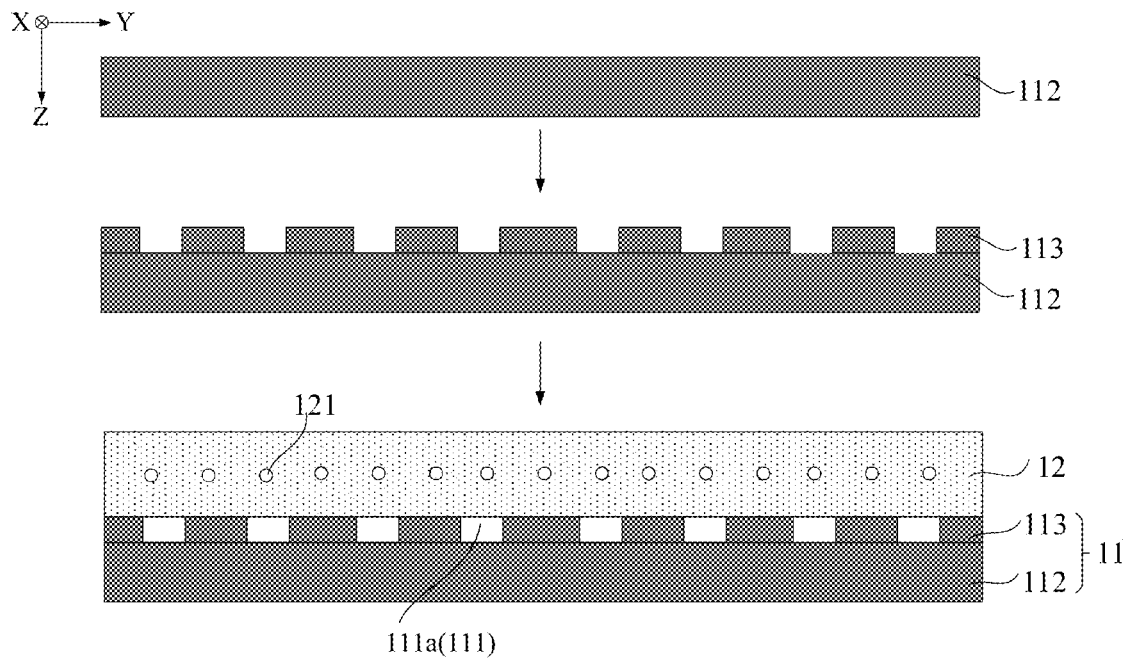
FIG. 28 is a diagram showing some other steps for fabricating a conductive adhesive film, in accordance with some embodiments.

In S11, with reference to FIG. 28, the first base material 112 is provided.

In this step, with reference to FIG. 28, the first base material 112 has a sheet-shaped structure, so that other structures may be provided on a surface of the first base material 112. For example, the first film blocks 113 may be provided on the surface of the first base material 112.

In S12, with reference to FIG. 28, the plurality of first film blocks 113 are formed on the side of the first base material 112. Two adjacent first film blocks 113 and the first base material 112 provide a clearance groove of the at least one clearance groove 111a together.

In this step, with reference to FIG. 28, the plurality of first film blocks 113 are arranged at intervals on the surface of the first base material 112, and a shape and a size of the clearance groove 111a is determined jointly by opposite side surfaces of two adjacent first film blocks 113 and a surface proximate to the first film blocks 113 of the first base material 112. With reference to FIG. 28, the first film blocks 113 each have a cuboid-shaped structure. That is to say, the opposite side surfaces of the two adjacent first film blocks 113 and the surface of the first base material 112 proximate to the first film blocks 113 are all flat, and a section of the clearance groove 111a in a plane perpendicular to an extension direction of the clearance groove 111a is in a shape of a rectangle.

In some examples, with continued reference to FIG. 28, the clearance groove 111a provided by the first base material 112 and the first film blocks 113 extends in the direction parallel to the first film layer 11.

In some examples, the first base material 112 and the first film blocks 113 are made of a same material, which makes the first film layer 11 have good integrity.

Figure 29:
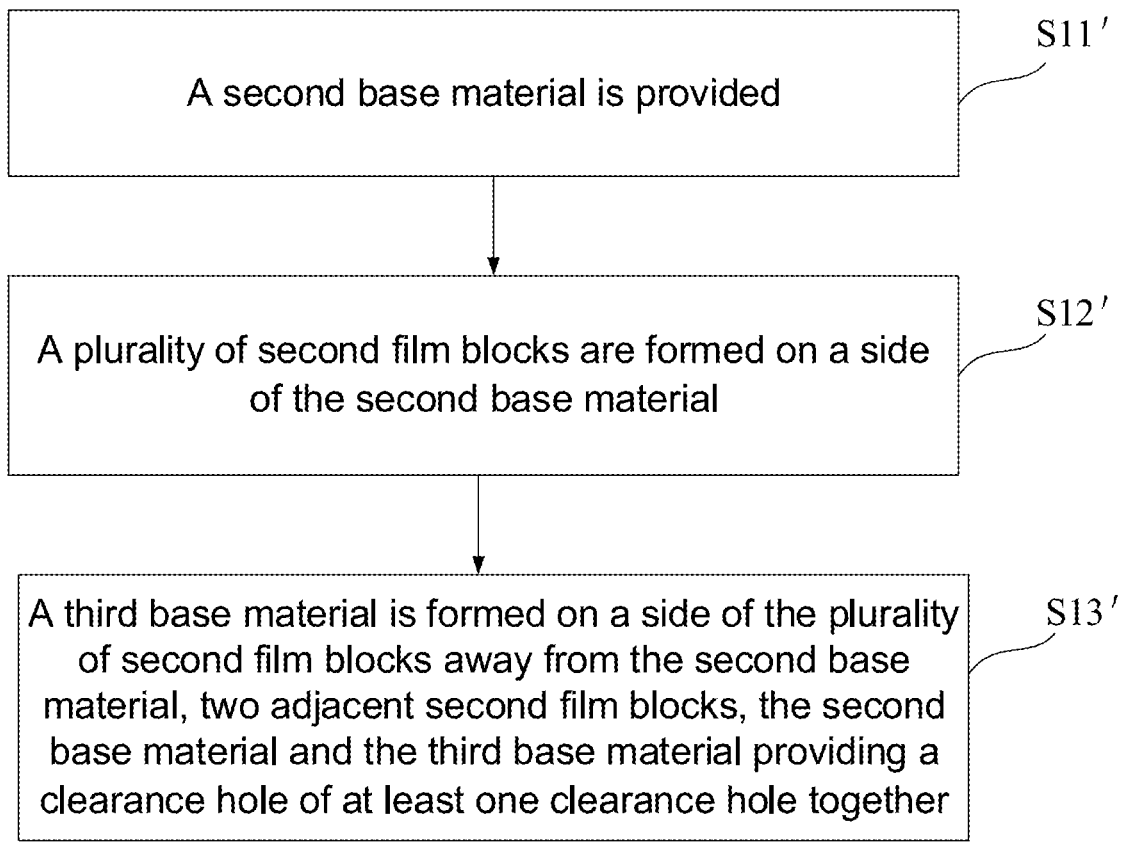
FIG. 29 is a flowchart of yet another method for fabricating a conductive adhesive film, in accordance with some embodiments.

In some embodiments, with reference to FIGS. 13 to 17, the plurality of clearance structures 111 includes a plurality of clearance holes 111b. With reference to FIG. 29, the step of forming the first film layer 11 include steps S11' to S13'.

In S11', the second base material 114 is provided.

Figure 30:
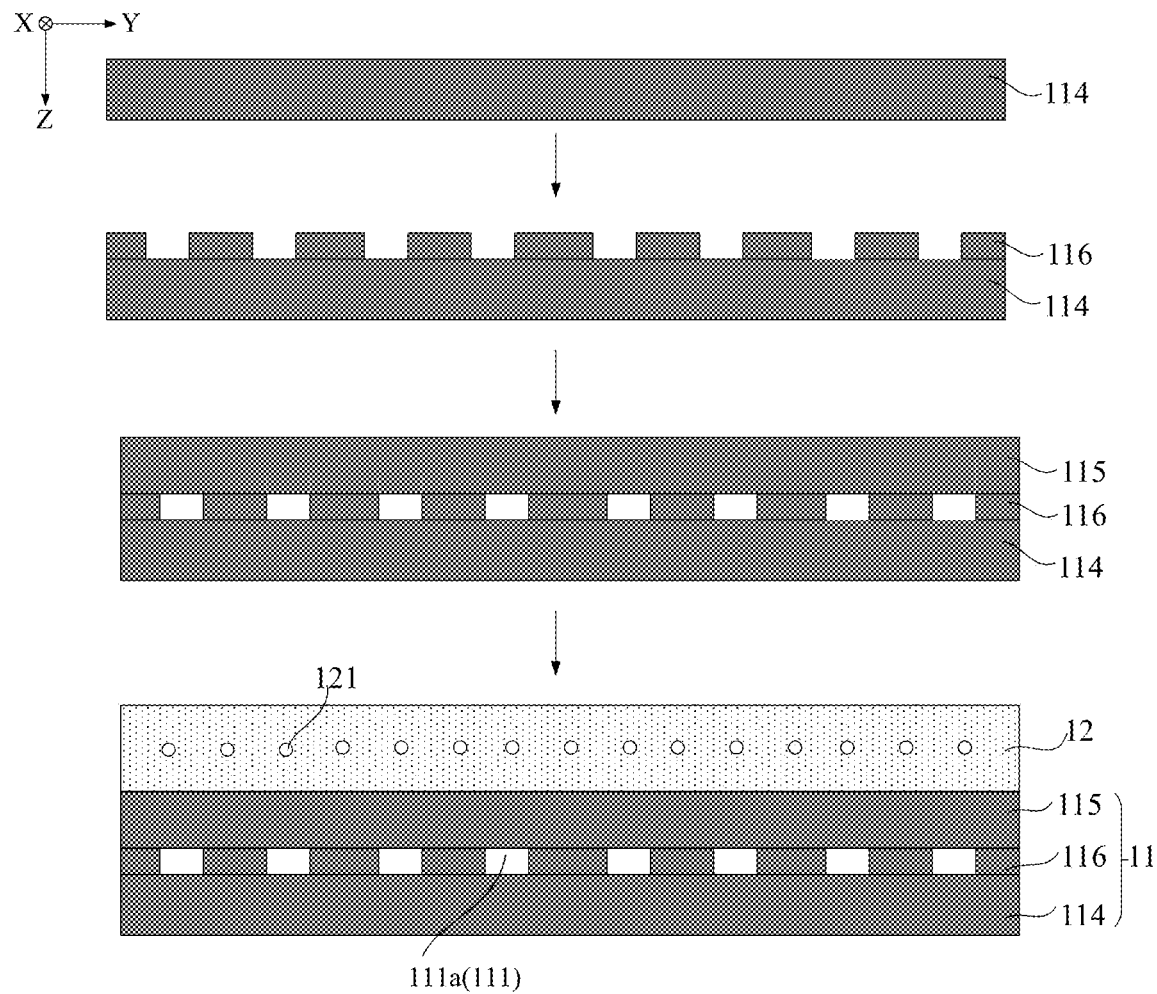
FIG. 30 is a diagram showing yet some other steps for fabricating a conductive adhesive film, in accordance with some embodiments.

In this step, with reference to FIG. 30, the second base material 114 is sheet-shaped, so that other structures may be provided on a surface of the second base material 114. For example, the second film blocks 116 may be provided on the surface of the second base material 114.

In S12', the plurality of second film blocks 116 are formed on the side of the second base material 114.

In this step, the plurality of second film blocks 116 are arranged on the surface of the second base material 114 at intervals. With reference to FIG. 30 again, the second film block 116 has a cuboid-shaped structure.

In S13', the third base material 115 is formed on a side of the plurality of second film blocks 116 away from the second base material 114. Two adjacent second film blocks 116, the second base material 114 and the third base material 115 provide a clearance hole 111b of at least one clearance hole 111b together.

In this step, with continued reference to FIG. 30, the third base material 115 is also a sheet-shaped structure, and an axis of the clearance hole 111b provided by the second base material 114, the second film blocks 116 and the third base material 115 is parallel to the first film layer 11. A shape of the clearance hole 111b is determined jointly by shapes of a surface of the second base material 114, a surface of the third base material 115 disposed opposite to the surface of the second base material 114, and opposite side surfaces of the two adjacent second film blocks 116. The second film block 116 is of a cuboid-shaped structure, a section of the clearance hole 111b provided by the second base material 114, the second film blocks 116 and the third base material 115 in an axis direction of the clearance hole 111b is rectangular.

In some examples, the second base material 114, the second film blocks 116 and the third base material 115 are made of a same material, which makes the first film layer 11 have good integrity.

Figure 31:
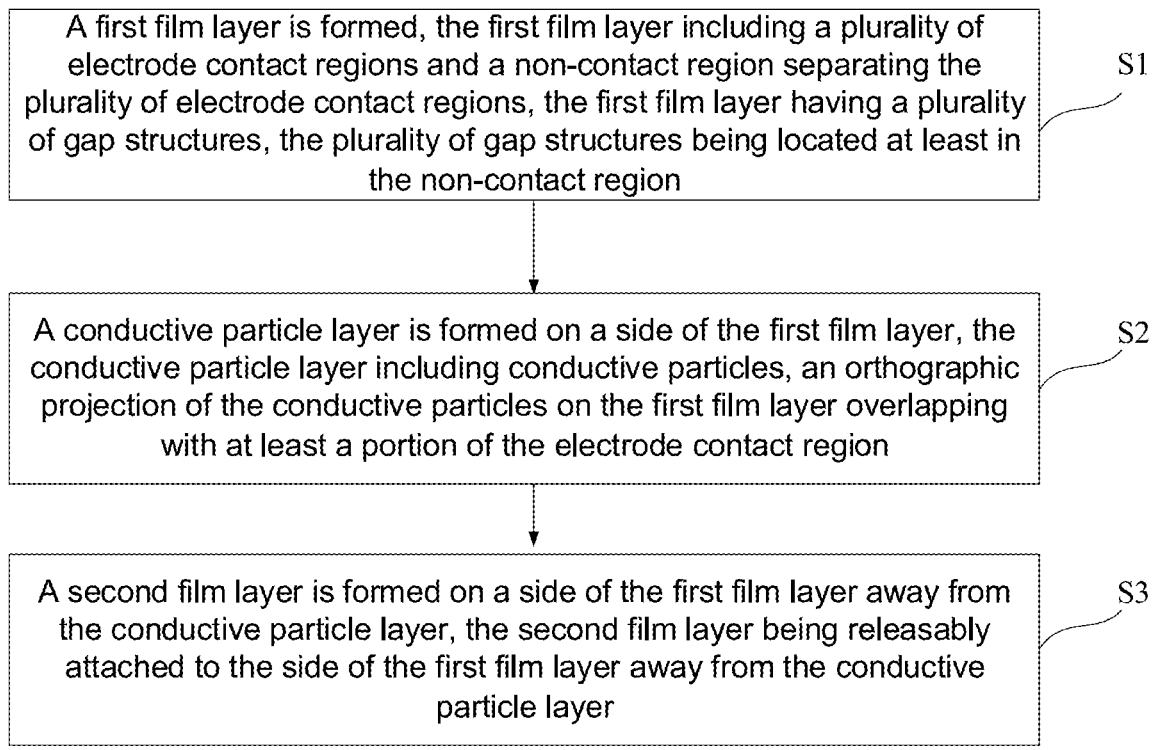
FIG. 31 is a flowchart of yet another method for fabricating a conductive adhesive film, in accordance with some embodiments.

In some embodiments, with reference to FIG. 31, the method for fabricating the conductive adhesive film 1 further includes a step S3.

Figure 32:
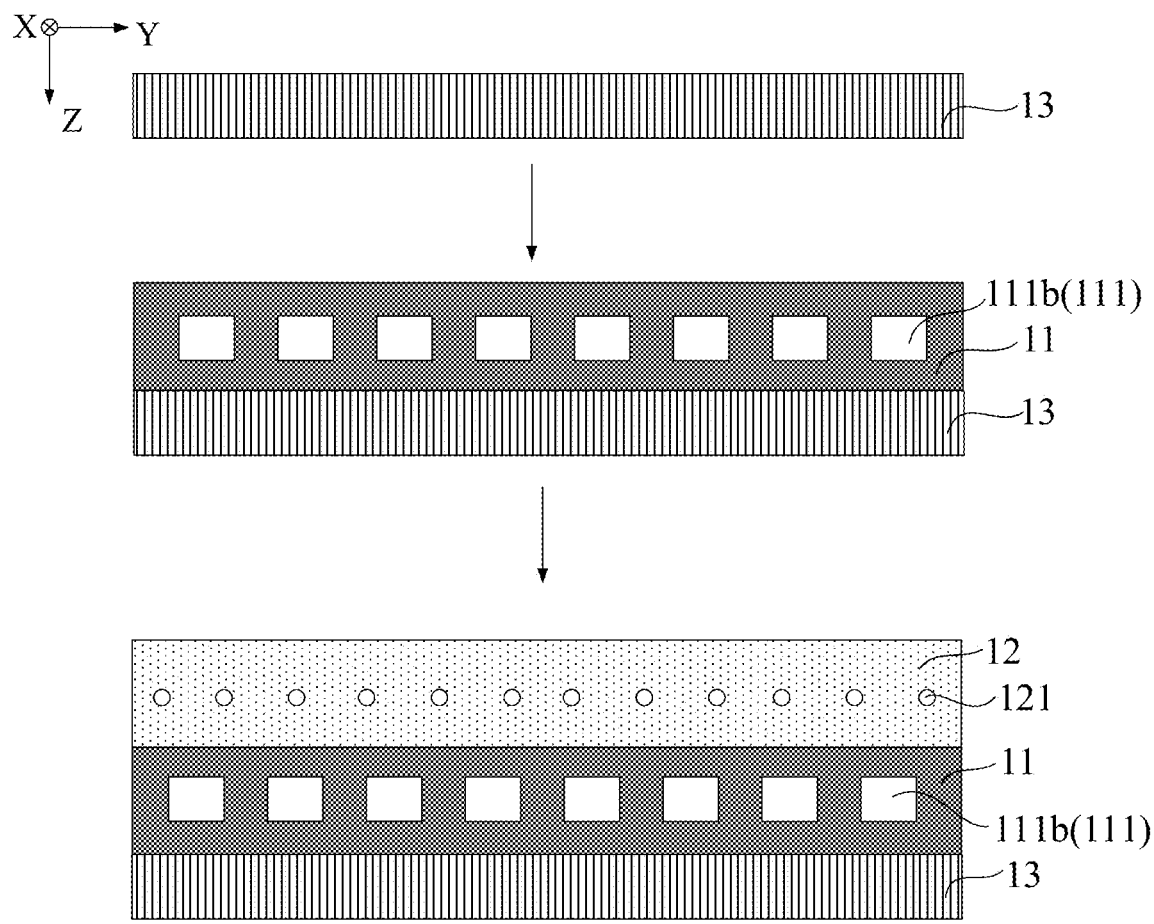
FIG. 32 is a diagram showing yet some other steps for fabricating a conductive adhesive film, in accordance with some embodiments.

In S3, with reference to FIG. 32, the second film layer 13 is formed on the side of the first film layer 11 away from the conductive particle layer 12. The second film layer 13 is releasably attached to the side of the first film layer 11 away from the conductive particle layer 12.

In this step, the second film layer 13 may be used to protect the first film layer 11 from being contaminated or damaged.

It will be noted that, an order of the steps S1, S2 and S3 are not specifically limited in embodiments of the present disclosure. In some examples, the conductive adhesive film 1 may be fabricated in the order from S1, S2 to S3 (S1-S2-S3). In some other examples, the conductive adhesive film 1 may be fabricated in the order from S1, S3 to S2 (S1-S3-S2). In yet some other examples, the conductive adhesive film 1 may be fabricated in the order from S3, S1 to S2 (S3-S1-S2). With reference to FIG. 32, when the conductive adhesive film 1 is fabricated, the second film layer 13 may be first provided, and then the first film layer 11 is provided on a surface of the second film layer 13, and the gap structures 111 (i.e., the clearance holes 111b) are provided in the first film layer 11, and finally the conductive particle layer 12 is provided on a side of the first film layer 11 away from the second film layer 13.

Figure 33:
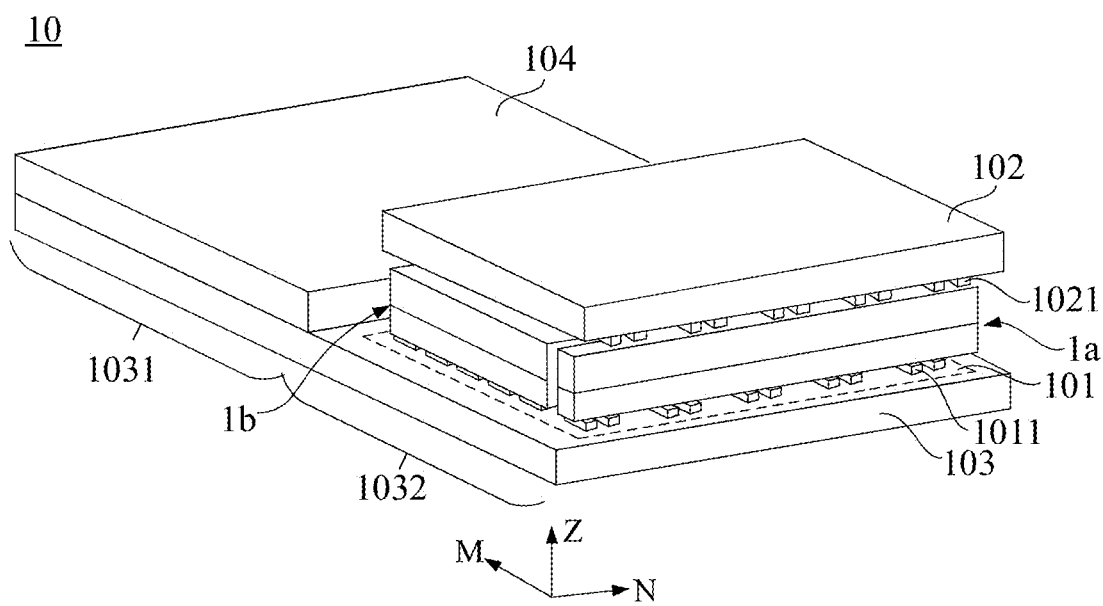
FIG. 33 is a diagram showing a stacked structure of yet another electronic device before a conductive adhesive film is pressed, in accordance with some embodiments.

Some embodiments of the present disclosure provide an electronic device 10. FIG. 33 is a diagram showing a stacked structure of the electronic device before a conductive adhesive film is pressed in accordance with some embodiments, and FIG. 34 is a diagram showing a structure where the conductive adhesive film disposed on a substrate in accordance with some embodiments. With reference to FIGS. 33 and 34, the electronic device 10 includes: a substrate 101 and a driving chip 102. The substrate 101 has a chip mounting region. The substrate 101 includes a plurality of first raised electrodes 1011 located in the chip mounting region. The plurality of first raised electrodes 1011 are arranged at intervals. The driving chip 102 has a plurality of second raised electrodes 1021, and the plurality of second raised electrodes 1021 are arranged at intervals. The plurality of first raised electrodes 1011 of the substrate 101 are bonded to the plurality of second raised electrodes 1021 of the driving chip 102 through a plurality of conductive adhesive films. The plurality of conductive adhesive films are arranged in a plane parallel to the substrate 101.

The above "a plurality of conductive adhesive films" refers to at least two conductive adhesive films. A conductive adhesive film may be the conductive adhesive film 1 described in any one of the above embodiments, or may be other conductive adhesive films such as a conductive adhesive film without gap structures 111.

In a case where the substrate 101 is bonded to the driving chip 102 through the plurality of conductive adhesive films, and the plurality of conductive adhesive films are arranged at intervals, it may be possible to provide space(s) for overflow of the adhesive solution and improve the adhesive-overflowing uniformity.

In some embodiments, with reference to FIG. 34, the plurality of first raised electrodes 1011 are arranged in a plurality of rows and a plurality of columns. First raised electrodes 1011 in a first row are input electrodes 1011a, and first raised electrodes 1011 in the remaining rows are output electrodes 1011b. A distance between the input electrodes 1011a and adjacent row of output electrodes 1011b is greater than a distance between two adjacent rows of output electrodes 1011b. The plurality of conductive adhesive films include a first conductive adhesive film 1a and a second conductive adhesive film 1b. The first conductive adhesive film 1a is located between the input electrodes 1011a and corresponding second raised electrodes 1021, and the second conductive adhesive film 1b is located between the output electrodes 1011b and corresponding second raised electrode 1021.

By such a design, it may be possible to provide a sufficient space for overflow of the adhesive solution between the input electrodes 1011a and the output electrodes 1011b, thereby ensuring that adhesive solution at positions where the input electrodes 1011a and the output electrodes 1011b are located may effectively escape. Therefore, overall adhesive-overflowing uniformity is improved.

Some embodiments of the present disclosure provide a method for manufacturing an electronic device. The method is used for manufacturing the electronic device 10. With reference to FIG. 35, the method includes steps S1' to S4'.

In S1', the substrate 101 is provided. The substrate 101 has the chip mounting region, and includes the plurality of first raised electrodes 1011 located in the chip mounting region. The plurality of first raised electrodes 1011 are arranged at intervals.

Figure 36:
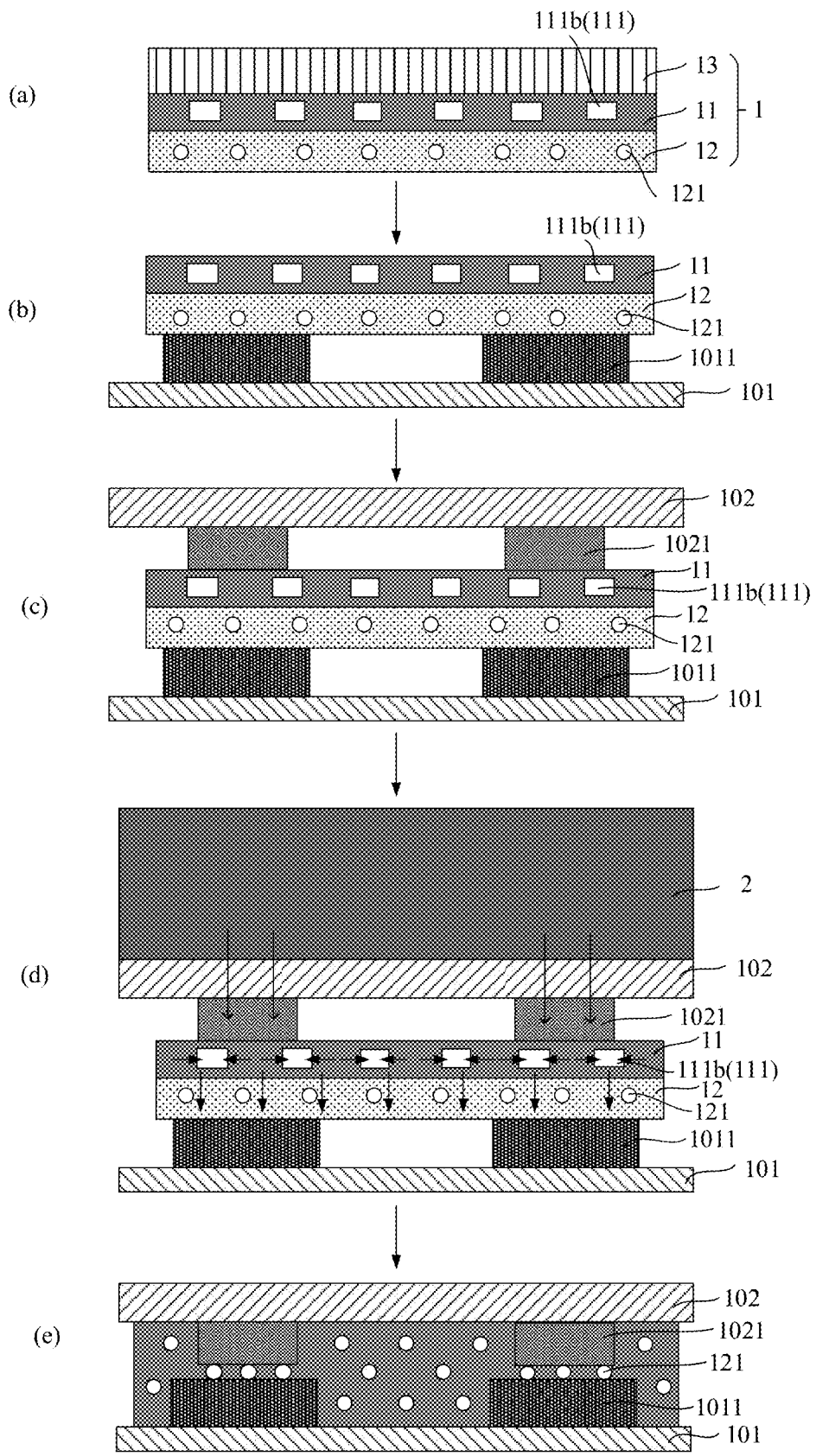
FIG. 36 is a diagram showing steps for manufacturing an electronic device, in accordance with some embodiments.

With reference to FIGS. 18 and 36, the first raised electrodes 1011 in the substrate 101 are arranged in the plurality of rows and the plurality of columns. The first raised electrodes 1011 are used for being bonded to the second raised electrodes 1021 of the driving chip 102 described below. It will be noted that, FIG. 36 only shows an example for a number and an arrangement of the first raised electrodes 1011 in the substrate 101, which is not intended to be a specific limitation of embodiments of the present disclosure.

In S2', the driving chip 102 is provided. The driving chip 102 has the plurality of second raised electrodes 1021, and the plurality of second raised electrodes 1021 are arranged at intervals.

With continued reference to FIG. 36, the second raised electrodes 1021 are disposed opposite to the first raised electrodes 1011 to be bonded thereto in one-to-one correspondence.

In S3', at least one conductive adhesive film 1 is provided between the plurality of first raised electrodes 1011 and the plurality of second raised electrodes 1021.

The "at least one conductive adhesive film 1" means that, a one-piece conductive adhesive film 1 or a plurality pieces of conductive adhesive films 1 are provided between the first raised electrodes 1011 and the second raised electrodes 1021.

In some examples, with reference to FIGS. 36 and 37, the step S3' includes steps S31 to S32.

In S31, the conductive adhesive film 1 is provided, the second film layer 13 of the conductive adhesive film 1 is removed, and the conductive particle layer 12 of the conductive adhesive film 1 is attached to the substrate 101, so as to make the conductive adhesive film 1 completely cover the first raised electrodes 1011 of the substrate 101.

With reference to FIG. 36, (a) in FIG. 36 shows a step of providing the conductive adhesive film 1 having the second film layer 13. With continued reference to FIG. 36, (b) in FIG. 36 shows a step of attaching the conductive adhesive film 1 to the first raised electrodes 1011 of the substrate 101 after the second film layer 13 of the conductive adhesive film 1 is removed.

In this step, an attachment temperature for the conductive adhesive film 1 is T1, where T1 satisfies: T1 is greater than or equal to 60° C. and less than or equal to 80° C. (60° C.≤T1≤80° C.). For example, T1 is equal to 60° C. (T1=60° C.), T1 is equal to 70° C. (T1=70° C.), or T1 is equal to 80° C. (T1=80° C.). An attachment pressure is F1, where F1 satisfies:

F1 is greater than or equal to 80 N and less than or equal to 120 N (80 N≤F1≤120 N). For example, F1 is equal to 80 N (F1=80 N), F1 is equal to 100 N (F1=100 N), or F1 is equal to 120 N (F1=120 N).

In S32, the driving chip 102 is attached to the side of the first film layer 11 away from the conductive particle layer 12, so as to make the second raised electrodes 1021 correspond to the first raised electrodes 1011 in a one-to-one manner.

With reference to FIG. 36, (c) in FIG. 36 shows a step of attaching the driving chip 102 to a side of the conductive adhesive film 1 away from the substrate 101. A temperature at which the driving chip 102 is attached to the conductive adhesive film 1 is T2, where T2 satisfies:

T2 is greater than or equal to 70° C. and less than or equal to 90° C. (70° C.≤T2≤90° C. For example, T2 is equal to 70° C. (T2=70° C.), T2 is equal to 75° C. (T2=75° C.), or T2 is equal to 90° C. (T2=90° C.).

An attachment pressure is F2, where F2 satisfies: F2 is greater than or equal to 80 N and less than or equal to 100 N (80 N≤F2≤100 N). For example, F2 is equal to 80 N (F2=80 N), F2 is equal to 85 N (F2=85 N), or F2 is equal to 100 N (F2=100 N). In this step, the substrate 101 and the driving chip 102 may be preliminarily fixed together through the conductive adhesive film 1.

In S4', the driving chip 102 and the substrate 101 are pressed together, so as to bond the plurality of first raised electrodes 1011 to the plurality of second raised electrodes 1021.

With reference to FIG. 36, (d) in FIG. 36 shows a step of pressing the driving chip 102 against the substrate 101 through a head 2.

In some examples, a pressing temperature is T3, where T3 satisfies: T3 is greater than or equal to 185° C. and less than or equal to 195° C. (185° C.≤T3≤195° C.). For example, T3 is equal to 185° C. (T3=185° C.), T3 is equal to 187° C. (T3=187° C.), or T3 is equal to 195° C. (T3=195° C.). A pressing pressure is F3, where F3 satisfies:

F3 is greater than or equal to 250 N and less than or equal to 450 N (250 N≤F3≤450 N). For example, F3 is equal to 250 N (F3=250 N), F3 is equal to 300 N (F3=300 N), or F3 is equal to 450 N (F3=450 N).

In some examples, the conductive adhesive film 1 is any one of the conductive adhesive films 1 as described above. For example, with continued reference to FIG. 36, the first film layer 11 of the conductive adhesive film 1 is provided therein with the clearance holes 111b. When the head 2 presses the driving chip 102 against the substrate 101, the adhesive solution of the first film layer 11 flows in a direction of the arrows in the figure (i.e., (d) in FIG. 36), and the clearance holes 111b provide spaces for overflow of the adhesive solution. The adhesive solution in the first film layer 11 flows towards the conductive particle layer 12. When the first raised electrodes 1011 approach the second raised electrodes 1021 to a certain distance, a portion of the conductive particles 121 are pushed into a region between the first raised electrodes 1011 and the corresponding second raised electrodes 1021, and the portion of the conductive particles 121 are deformed by a certain degree of compression. Therefore, it is ensured that the portion of the conductive particles 121 are in good contact with the first raised electrodes 1011 and the second raised electrodes 1021, so that a good conductive effect is achieve.

In some other examples, there are a plurality of conductive adhesive films, and the plurality of conductive adhesive films are arranged at intervals in the plane parallel to the substrate 101 before the driving chip 102 and the substrate 101 are pressed together. It will be noted that, in these examples, the conductive adhesive film is provided therein without gap structures 111.

Figure 38:
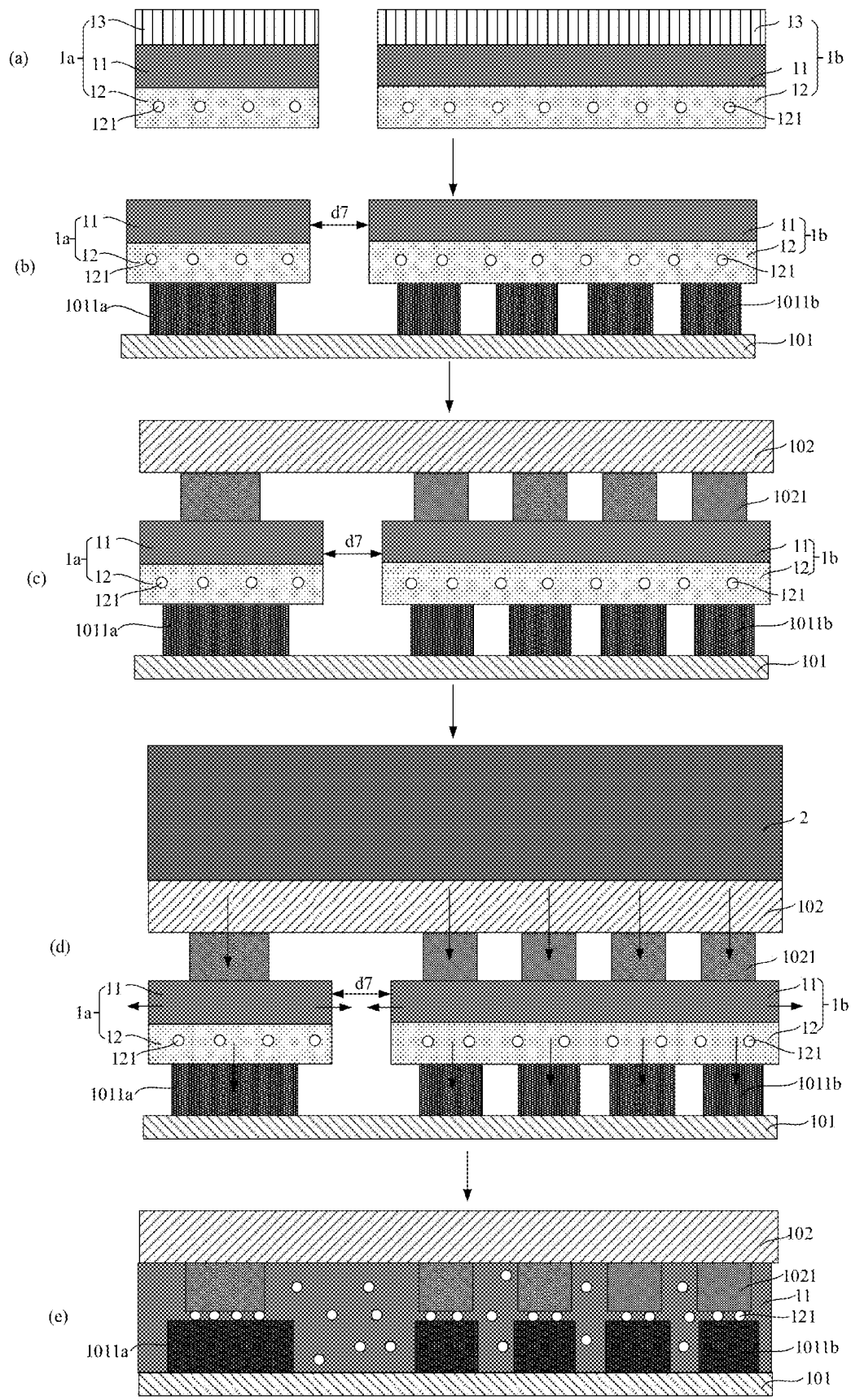
FIG. 38 is a diagram showing some other steps for manufacturing an electronic device, in accordance with some embodiments.

With reference to FIG. 38, the substrate 101 is bonded to the driving chip 102 through two conductive adhesive films. The first conductive adhesive film 1a covers the input electrodes 1011a, and the second conductive adhesive film 1b covers the output electrodes 1011b. A distance d7 exists between the first conductive adhesive film 1a and the second conductive adhesive film 1b before the two are pressed, a value range of the distance d7 is from 300 μm to 500 μm, inclusive (300 μm≤d7≤500 μm). For example, d7 is equal to 300 μm (d7=300 μm), d7 is equal to 400 μm (d7=400 μm), or d7 is equal to 500 μm (d7=500 μm). The conductive adhesive films are not provided with a gap structure 111. Since the first conductive adhesive film 1a and the second conductive adhesive film 1b are arranged at intervals, a space for overflow of the adhesive solution is provided, which improves adhesive overflowing effects and ensures that the adhesive solution effectively overflows.

With reference to FIG. 38, (b) in FIG. 38 shows a step of attaching the first conductive adhesive film 1a and the second conductive adhesive film 1b on the first raised electrodes 1011 of the substrate 101 separately, after second film layers 13 on the first conductive adhesive film 1a and the second conductive adhesive film 1b are removed respectively. The first conductive adhesive film 1a covers the input electrodes 1011a, and the second conductive adhesive film 1b covers the output electrodes 1011b. In this step, an attachment temperature for the first conductive adhesive film 1a and the second conductive adhesive film 1b is T4, where T4 satisfies: T4 is greater than or equal to 60° C. and less than or equal to 80° C. (60° C.≤T4≤80° C.). For example, T4 is equal to 60° C. (T4=60° C.), T4 is equal to 70° C. (T4=70° C.), or T4 is equal to 80° C. (T4=80° C.). An attachment pressure is F4, where F4 satisfies:

F4 is greater than or equal to 80 N and less than or equal to 120 N (80 N≤F4≤120 N). For example, F4 is equal to 80 N (F4=80 N), F4 is equal to 100 N (F4=100 N), or F4 is equal to 120 N (F4=120 N).

With reference to FIG. 38, (c) in FIG. 38 shows a step of attaching the driving chip 102 to a side, away from the substrate 101, of the first conductive adhesive film 1a and the second conductive adhesive film 1b. A temperature at which the driving chip 102 is attached to the conductive adhesive films is T5, where T5 satisfies: T5 is greater than or equal to 70° C. and less than or equal to 90° C. (70° C.≤T5≤90° C.). For example, T5 is equal to 70° C. (T5=70° C.), T5 is equal to 75° C. (T5=75° C.), or T5 is equal to 90° C. (T5=90° C.). An attachment pressure is F5, where F5 satisfies: F5 is greater than or equal to 80 N and less than or equal to 100 N (80 N≤F5≤100 N). For example, F5 is equal to 80 N (F5=80 N), F5 is equal to 90 N (F5=90 N), or F5 is equal to 100 N (F5=100 N). In this step, the substrate 101 and the driving chip 102 may be preliminarily fixed together through the conductive adhesive films.

With reference to FIG. 38, (d) in FIG. 38 shows a step of pressing the driving chip 102 against the substrate 101 through a head 2. In this step, a pressing temperature is T6, where T6 satisfies: T6 is greater than or equal to 185° C. and less than or equal to 195° C. (185° C.≤T6≤195° C.). For example, T6 is equal to 185° C. (T6=185° C.), T6 is equal to 190° C. (T6=190° C.), or T6 is equal to 195° C. (T6=195° C.). A pressing pressure is F6, where F6 satisfies:

F6 is greater than or equal to 250 N and less than or equal to 450 N (250 N≤F6≤450 N). For example, F6 is equal to 250 N (F6=250 N), F6 is equal to 300 N (F6=300 N), or F6 is equal to 450 N (F6=450 N).

It will be noted that, the temperatures and pressures should be selected depending on actual production processes, which are not specifically limited in embodiments of the present disclosure. For example, different temperatures and pressures are selected depending on different materials of the first film layer 11. For a material that is flowable at a low temperature, a low temperature and a low pressure is selected; and for a material that require a high temperature to flow, a high temperature and a high pressure is selected. In addition, by increasing the temperature, fluidity of the adhesive solution is improved, thus the pressure may be appropriately lowered; or the temperature may be appropriately lowered by raising the pressure.

In some other examples, it may be possible to arrange three or more conductive adhesive films 1 at intervals. A number of conductive adhesive films 1 is not specifically limited in the present disclosure.

To sum up, in the conductive adhesive film 1 provided in some embodiments of the present disclosure, by providing the plurality of gap structures 111 that are located at least in the non-contact region Q2, the adhesive solution may flow into the gap structures 111 when the adhesive solution overflows during bonding. Compared with an adhesive film of a solid structure, the conductive adhesive film 1 may have a larger space for overflow of the adhesive solution by means of the gap structures 111 disposed in the non-contact region Q2, which ensures that the adhesive solution effectively escapes from regions between the first raised electrodes 1011 and the second raised electrodes that are to be bonded, and ameliorates the accumulation of the adhesive material and the conductive particles 121 between the electrodes to be bonded. Therefore, the contact rate of effective conductive particles 121 between the first raised electrodes 1011 and the second raised electrodes 1021 to be bonded may also be improved, and the risk of weak pressure may be reduced. The effective conductive particle 121 refers to a conductive particle 121 that enables a first raised electrode 1011 to be electrically connected to a second raised electrode 1021 after bonding. In addition, by providing the gap structures 111, it is beneficial to save a material of the conductive adhesive film, thereby reducing production costs of the conductive adhesive film 1. By controlling the sizes and the arrangement of the gap structures 111, the direction in which the adhesive solution overflows may be controlled, and the fluidity of the adhesive solution may be improved, so that adhesive-overflowing uniformity at different positions and in different directions may be improved, and then the bonding error of structures to be bonded may be reduced. The electronic device 10 provided in some embodiments of the present disclosure adopts the conductive adhesive film 1. Therefore, during bonding, the adhesive-overflowing uniformity is improved, bonding effects of the electronic device 10 is good, bonding time is reduced, and difficulty of bonding is reduced.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A conductive adhesive film, comprising:
a first film layer, the first film layer having a plurality of electrode contact regions and a non-contact region separating the plurality of electrode contact regions, the first film layer having a plurality of gap structures therein, the plurality of gap structures being located at least in the non-contact region; and
a conductive particle layer, located on a side of the first film layer, the conductive particle layer including conductive particles, and an orthographic projection of the conductive particles on the first film layer overlapping with at least a portion of each electrode contact region.

2. The conductive adhesive film according to claim 1, wherein the plurality of gap structures are further located in the electrode contact regions.

3. The conductive adhesive film according to claim 2, wherein for the plurality of gap structures, a total volume of gap structures located in the non-contact region is greater than a total volume of gap structures located in the electrode contact regions.

4. The conductive adhesive film according to claim 3, wherein for the plurality of gap structures, a density of the gap structures located in the non-contact region is greater than a density of the gap structures located in the electrode contact regions; or
for the plurality of gap structures, an area of a cross section of a gap structure located in the non-contact region is greater than an area of a cross section of a gap structure located in the electrode contact region, wherein each cross section is perpendicular to an extension direction of a respective gap structure.

5. The conductive adhesive film according to claim 1, wherein
the plurality of gap structures include at least one clearance groove, and each clearance groove is located on the side of the first film layer proximate to the conductive particle layer or on a side of the first film layer away from the conductive particle layer; or
the plurality of gap structures include at least one clearance hole, and an axis of the at least one clearance hole is parallel to the first film layer.

6. The conductive adhesive film according to claim 5, wherein in a case where the plurality of gap structures include the at least one clearance groove,
a section, in a plane perpendicular to an extension direction of the at least one clearance groove, of the at least one clearance groove is in a shape of a rectangle, a trapezoid or a U-shape; and/or
the at least one clearance groove is a through groove extending in a direction parallel to the first film layer.

7. The conductive adhesive film according to claim 5, wherein in a case where the plurality of gap structures include the at least one clearance groove, the first film layer includes:
a first base material and a plurality of first film blocks, the plurality of first film blocks being disposed on a side of the first base material, two adjacent first film blocks and the first base material provide a clearance groove of the at least one clearance groove together.

8. The conductive adhesive film according to claim 5, wherein in a case where the plurality of gap structures include the at least one clearance hole, a section, in a plane perpendicular to a direction of the axis of the at least one clearance hole, of the at least one clearance hole is in a shape of a circle, an ellipse or a rectangle; and/or
the at least one clearance hole is a through hole.

9. The conductive adhesive film according to claim 5, wherein in a case where the plurality of gap structures include the at least one clearance groove, the first film layer includes:
a second base material, a third base material and a plurality of second film blocks, the plurality of second film blocks being disposed between the second base material and the third base material, two adjacent second film blocks, the second base material and the third base material provide a clearance hole of the at least one clearance hole together.

10. The conductive adhesive film according to claim 1, wherein the plurality of gap structures extend in a first direction and are sequentially arranged in a second direction,
wherein the first direction is perpendicular to the second direction, and both the first direction and the second direction are parallel to the first film layer.

11. The conductive adhesive film according to claim 10, wherein
a maximum dimension of at least one gap structure of the plurality of gap structures in a third direction is $c_1$;
a dimension of the first film layer in the third direction is $a_1$, and the third direction is perpendicular to the first film layer; and
$c_1$ and $a_1$ satisfy: $c_1$ is equal to $k_0$ times $a_1$ ($c_1=k_0 \times a_1$), and $k_0$ is greater than or equal to 20% and less than or equal to 30% ($20\% \leq k_0 \leq 30\%$).

12. The conductive adhesive film according to claim 11, wherein
two adjacent gap structures have a first distance $d_1$ therebetween, and $d_1$ satisfies:
$d_1$ is equal to $k_1$ times $c_1$ ($d_1=k_1 \times c_1$), and $k_1$ is greater than or equal to 2 and less than or equal to 3 ($2 \leq k_1 \leq 3$); or
the first film layer has a first region and a second region that are sequentially arranged in the second direction; within the first region, two adjacent gap structures have a second distance $d_2$ therebetween; within the second region, two adjacent gap structures have a third distance $d_3$ therebetween; and $d_2$ and $d_3$ satisfy: $d_2$ is equal to $k_2$ times $c_1$ ($d_2=k_2 \times c_1$), $k_2$ is greater than or equal to 2 and less than or equal to 3 ($2 \leq k_2 \leq 3$), $d_3$ is equal to $k_3$ times $c_1$ ($d_3=k_3 \times c_1$), and $k_3$ is greater than or equal to 4 and less than or equal to 6 ($4 \leq k_3 \leq 6$); or
the first film layer has a third region, a fourth region and a fifth region that are sequentially arranged in the second direction; within the third region, two adjacent gap structures have a fourth distance $d_4$ therebetween; within the fourth region, two adjacent gap structures have a fifth distance $d_5$ therebetween; within the fifth region, two adjacent gap structures have a sixth distance $d_6$ therebetween; and $d_4$, $d_5$ and $d_6$ satisfy: $d_4$ and $d_6$ each are equal to $k_4$ times $c_1$ ($d_4=d_6=k_4 \times c_1$), $k_4$ is greater than or equal to 1 and less than or equal to 1.5 ($1 \leq k_4 \leq 1.5$), $d_5$ is equal to $k_5$ times $c_1$ ($d_5=k_5 \times c_1$), and $k_5$ is greater than or equal to 4 and less than or equal to 6 ($4 \leq k_5 \leq 6$); or $d_4$, $d_5$ and $d_6$ satisfy: $d_4$ is equal to $k_6$ times $c_1$ ($d_4=k_6 \times c_1$), $k_6$ is greater than or equal to 1 and less than or equal to 1.5 ($1 \leq k_6 \leq 1.5$), $d_5$ is equal to $k_7$ times $c_1$ ($d_5=k_7 \times c_1$), $k_7$ is greater than or equal to 2 and less than or equal to 3 ($2 \leq k_7 \leq 3$), $d_6$ is equal to k8 times c1 (d6=k8×c1), and k8 is greater than or equal to 4 and less than or equal to 6 (4≤k8≤6).

13. The conductive adhesive film according to claim 12, wherein in a case where the first film layer has the third region, the fourth region and the fifth region that are sequentially arranged in the second direction, a length of the first film layer in the second direction is L1, a length of the third region in the second direction is L2, a length of the fourth region in the second direction is L3, a length of the fifth region in the second direction is L4, and a sum of lengths of the third region and the fourth region in the second direction is L5;
   in a case where d4, d5 and d6 satisfy: d4=d6=k4×c1, 1≤k4≤1.5, d5=k5×c1, and 4≤k5≤6, L1, L2, L3 and L4 satisfy:
      L3 is equal to k9 times L1 (L3=k9×L1), and k9 is greater than or equal to 40% and less than or equal to 60% (40%≤k9≤60%);
      a sum of L2 and L4 is equal to k10 times L1 (L2+L4=k10×L1), and k10 is greater than or equal to 40% and less than or equal to 60% (40%≤k10≤60%), and L2 is equal to L4 (L2=L4); and
   in a case where d4, d5 and d6 satisfy: d4=k6×c1, 1≤k6≤1.5, d5=k7×c1, 2≤k7≤3, d6=k8×c1, and 4≤k8≤6, L2, L3 and L5 satisfy:
      L2 is equal to k11 times L5 (L2=k11×L5), and k11 is greater than or equal to 40% and less than or equal to 60% (40%≤k11≤60%); and
      L3 is equal to k12 times L5 (L3=k12×L5), and k12 is greater than or equal to 40% and less than or equal to 60% (40%≤k12≤60%).

14. The conductive adhesive film according to claim 1, further comprising:
   a second film layer, releasably attached to a side of the first film layer away from the conductive particle layer.

15. A method for fabricating a conductive adhesive film, the method comprising:
   forming a first film layer, the first film layer having a plurality of electrode contact regions and a non-contact region separating the plurality of electrode contact regions, the first film layer having a plurality of gap structures, the plurality of gap structures being located at least in the non-contact region; and
   forming a conductive particle layer on a side of the first film layer, the conductive particle layer including conductive particles, an orthographic projection of the conductive particles on the first film layer overlapping with at least a portion of each electrode contact region.

16. The method according to claim 15, wherein the plurality of gap structures include at least one clearance groove, and forming the first film layer includes:
   providing a first base material; and
   forming a plurality of first film blocks on a side of the first base material, wherein two adjacent first film blocks and the first base material provide a clearance groove of the at least one clearance groove together; or
   the plurality of gap structures include at least one clearance hole; forming the first film layer includes:
   providing a second base material;
   forming a plurality of second film blocks on a side of the second base material; and
   forming a third base material on a side of the plurality of second film blocks away from the second base material, wherein two adjacent second film blocks, the second base material and the third base material provide a clearance hole of the at least one clearance hole together.

17. The method according to claim 15, further comprising:
   forming a second film layer on a side of the first film layer away from the conductive particle layer, the second film layer being releasably attached to the side of the first film layer away from the conductive particle layer.

18. An electronic device, comprising:
   a substrate, having a chip mounting region, the substrate including a plurality of first raised electrodes located in the chip mounting region, the plurality of first raised electrodes being arranged at intervals; and
   a driving chip, having a plurality of second raised electrodes, the plurality of second raised electrodes being arranged at intervals, wherein
   the plurality of first raised electrodes of the substrate are bonded to the plurality of second raised electrodes of the driving chip through at least one conductive adhesive film each according to claim 1.

19. The electronic device according to claim 18, wherein the plurality of first raised electrodes are arranged in a plurality of rows and a plurality of columns, first raised electrodes in a first row are input electrodes, first raised electrodes in remaining rows are output electrodes, a distance between the input electrodes and output electrodes in an adjacent row is greater than a distance between output electrodes in two adjacent rows; and
   the plurality of gap structures of the conductive adhesive film extend in a row direction or a column direction of the plurality of first raised electrodes.

20. A method for manufacturing a display device, the method comprising:
   providing a substrate, the substrate having a chip mounting region, the substrate including a plurality of first raised electrodes located in the chip mounting region, the plurality of first raised electrodes being arranged at intervals;
   providing a driving chip, the driving chip having a plurality of second raised electrodes, the plurality of second raised electrodes being arranged at intervals;
   providing at least one conductive adhesive film between the plurality of first raised electrodes and the plurality of second raised electrodes; and
   pressing the driving chip and the substrate together, so as to bond the plurality of first raised electrodes to the plurality of second raised electrodes,
   wherein the conductive adhesive film is the conductive adhesive film according to claim 1;
   the at least one conductive adhesive film includes one conductive adhesive film; or,
   the at least one conductive adhesive film includes a plurality of the conductive adhesive films; and the plurality of conductive adhesive films are arranged at intervals in a plane parallel to the substrate before the driving chip and the substrate are pressed together.

* * * * *